US012621979B2

(12) United States Patent
Sharma et al.

(10) Patent No.: US 12,621,979 B2
(45) Date of Patent: May 5, 2026

(54) MULTI-TIER MEMORY STRUCTURE WITH GRADED CHARACTERISTICS

(71) Applicant: Intel Corporation, Santa Clara, CA (US)

(72) Inventors: Abhishek Anil Sharma, Portland, OR (US); Travis W. Lajoie, Forest Grove, OR (US); Forough Mahmoudabadi, Beaverton, OR (US); Shailesh Kumar Madisetti, Portland, OR (US); Van H. Le, Beaverton, OR (US); Timothy Jen, Portland, OR (US); Cheng Tan, Hillsboro, OR (US); Jisoo Kim, Portland, OR (US); Miriam R. Reshotko, Portland, OR (US); Vishak Venkatraman, Portland, OR (US); Eva Vo, Beaverton, OR (US); Yue Zhong, Portland, OR (US); Yu-Che Chiu, Hillsboro, OR (US); Moshe Dolejsi, Portland, OR (US); Lorenzo Ferrari, San Diego, CA (US); Akash Kannegulla, Hillsboro, OR (US); Deepyanti Taneja, Happy Valley, OR (US); Mark Armstrong, Portland, OR (US); Kamal H. Baloch, Portland, OR (US); Afrin Sultana, Portland, OR (US); Albert B. Chen, Portland, OR (US); Vamsi Evani, Hillsboro, OR (US); Yang Yang, Portland, OR (US); Juan G. Alzate-Vinasco, Tigard, OR (US); Fatih Hamzaoglu, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 145 days.

(21) Appl. No.: 17/742,628

(22) Filed: May 12, 2022

(65) Prior Publication Data

US 2023/0371233 A1     Nov. 16, 2023

(51) Int. Cl.
*H10B 12/00* (2023.01)
*H01L 23/528* (2006.01)
(Continued)

(52) U.S. Cl.
CPC ......... *H10B 12/30* (2023.02); *H01L 23/5283* (2013.01); *H10D 1/66* (2025.01); *H10D 30/6757* (2025.01)

(58) Field of Classification Search
CPC ...... H10B 12/30; H10B 12/312; H10B 12/05; H01L 23/5283; H10D 1/66; H10D 30/6757; H10D 30/6755; H10D 88/00
See application file for complete search history.

(56) References Cited

U.S. PATENT DOCUMENTS

2021/0375873 A1* 12/2021 Majhi ................... H10B 12/30
2021/0399052 A1* 12/2021 Wu ...................... H01L 23/5226

* cited by examiner

*Primary Examiner* — William B Partridge
*Assistant Examiner* — Chevy J Boegel
(74) *Attorney, Agent, or Firm* — Arcane Law PLLC

(57) ABSTRACT

Techniques are provided herein for forming multi-tier memory structures with graded characteristics across different tiers. A given memory structure includes memory cells, with a given memory cell having an access device and a storage device. The access device may include, for example, a thin film transistor (TFT) structure, and the storage device may include a capacitor. Certain geometric or material parameters of the memory structures can be altered in a graded fashion across any number of tiers to compensate for process effects that occur when fabricating a given tier, which also affect any lower tiers. This may be done to more closely match the performance of the memory arrays across each of the tiers.

20 Claims, 14 Drawing Sheets

(51) Int. Cl.
    *H10D 1/66*           (2025.01)
    *H10D 30/67*         (2025.01)

208

206

MULTI-TIER MEMORY STRUCTURE WITH GRADED CHARACTERISTICS

FIELD OF THE DISCLOSURE

The present disclosure relates to integrated circuits, and more particularly, to multi-tier memory structures in interconnect layers.

BACKGROUND

As integrated circuits continue to scale downward in size, a number of challenges arise. For instance, as transistor area decreases, so too do the dimensions for interconnects made to the various transistor structures, such as gate structures, drain regions, and source regions. Structures formed in such interconnect layers may be more susceptible to parasitic effects as they become more densely packed, or more susceptible to process effects as more and more layers are fabricated over them. Accordingly, there remain a number of non-trivial challenges with respect to the formation of backend structures in integrated circuits.

Figure 1A:
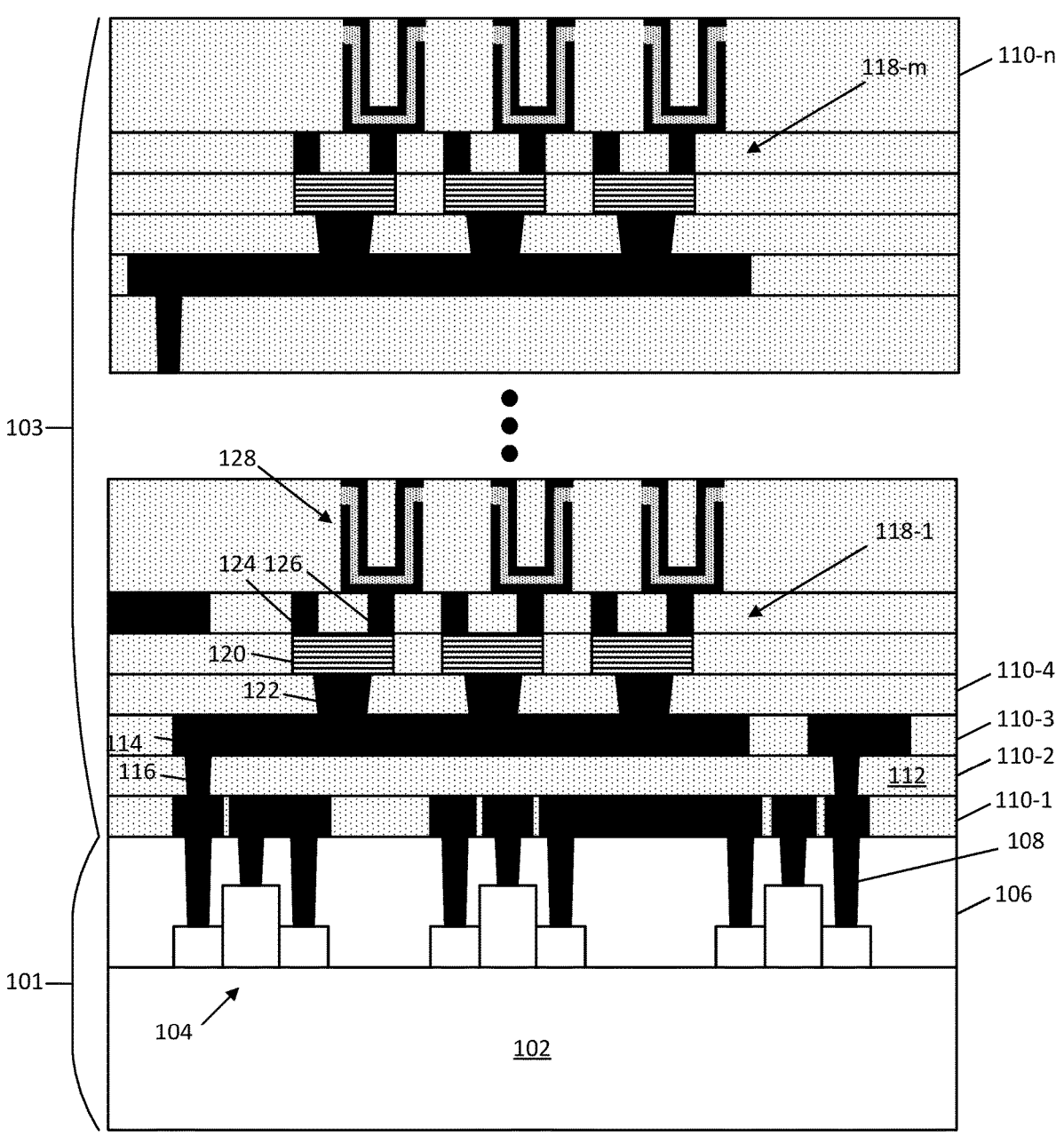
FIG. 1A is a cross-sectional view that illustrates an example portion of an integrated circuit configured with an interconnect region having tiers of memory structures over a plurality of semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein for forming multi-tier memory structures with graded characteristics across different tiers. A given memory structure generally includes memory cells, with each memory cell having an access device and a storage device. The access device may include, for example, a thin film transistor (TFT) structure, and the storage device may include a capacitor. In such cases, the TFT structure allows the capacitor to be accessed during write operations (to store a memory bit) and read operations (to read a previously-stored bit). Although the techniques can be used in any number of integrated circuit applications, they are particularly useful with respect to interconnect regions over size-constrained transistors of a given device layer. The transistors of the device layer can be, for example, finFETs, gate-all-around transistors, or other transistor technologies, and may be used for any number of functions, such as logic operations, storage operations, high-frequency operations, and input/output (I/O) operations, to name a few examples. An interconnect structure or region above or below a given device layer may include any number of interconnect layers. Some such interconnect layers may just contain interconnect features, while other such interconnect layers may just contain memory structures (e.g., TFTs and/or capacitors) or a combination of memory structures and interconnect features. According to some embodiments, the memory structures are arranged in a two-dimensional array within one or more interconnect layers and stacked in a vertical direction such that multiple tiers of memory structure arrays are formed within the interconnect region. Due to process effects from forming a given array of memory structures affecting all previously-formed arrays on lower tiers, various characteristics of the memory arrays can be altered as more tiers are fabricated. Certain geometric and/or material parameters of the memory structures can be intentionally altered in a graded fashion across any number of tiers to compensate for the process effects which affect any lower tiers. The grading can be done in a relatively linear or interpolative manner, moving from the lowermost tier to the uppermost tier (or vice-versa, depending on the process building direction). This may be done to more closely match the performance of the memory arrays across each of the tiers.

Example geometric and material parameters that can be graded include, for instance, concentration of oxygen or sulfur vacancies (e.g., higher concentration in tier k relative to tier k−1), semiconductor material concentration (e.g., lower gallium and higher indium concentration in tier k relative to tier k−1), nitrogen concentration (e.g., lower concentration in tier k relative to tier k−1), channel layer thickness (e.g., thicker in tier k relative to tier k−1), work function material type concentration (e.g., higher p-type work function material concentration in tier k and more n-type work function material concentration in tier k−1), gate dielectric thickness (e.g., thinner gate dielectric in tier k relative to tier k−1), area of contact-to-channel interface for source and drain contacts (e.g., higher area in tier k relative to tier k−1), channel area between the source and drain contacts (e.g., higher area in tier k relative to tier k−1), capacitor size (e.g., capacitors in tier k are smaller relative to the capacitors in tier k−1), thickness of capacitor dielectric (e.g., capacitor dielectric in tier k is thicker relative to capacitor dielectric in tier k−1), array size (e.g., array of cells in tier k is smaller relative to array of cells in tier k−1), or any combination of these geometric and material parameters. Numerous variations and embodiments will be apparent in light of this disclosure.

General Overview

As previously noted above, there are a number of non-trivial challenges with respect to forming backend structures within a given interconnect region of an integrated circuit. This is particularly true with respect to multi-tier memory structures that are formed within a series of interconnect layers. In more detail, the fabrication of each successive tier of memory structures subjects any lower tiers of memory structures to multiple process variations (such as temperature changes, pressure changes, and environment changes). For example, some process operations require high temperatures (e.g., 300-400° C.) and/or a reducing environment (e.g., oxygen deprived environment). Such processes can affect the already-formed memory structures on lower tiers, even though such lower tier structures may be protected by one or more layers (e.g., passivation and/or etch stop layers). As a result, memory performance between different tiers may be inconsistent, which may not be acceptable in some applications.

Thus, and in accordance with some embodiments of the present disclosure, techniques are provided herein to form tiers of backend memory structures with graded characteristics to counteract changes brought on by processing previously-formed tiers. The backend memory structures may be formed within various levels of interconnect layers over semiconductor devices (e.g., transistors) of a previously-formed device layer. Any kind of memory structure configurations can be used, such as those that employ thin film transistor (TFT) structures coupled with capacitor structures formed in the interconnect layers, to provide dynamic random-access memory (DRAM). According to some embodiments, a TFT structure includes a gate electrode, a gate dielectric over the gate electrode (for a backside gate configuration), a semiconductor or so-called channel region over the gate dielectric, and one or more contacts to the semiconductor region that act as source or drain regions for the transistor. Furthermore, in some embodiments, one of the contacts of each of the TFT structures is coupled to a corresponding capacitor formed within the interconnect region. The capacitor may have, for example, a metal-insulator-metal (MIM) structure, although other capacitor structures may be used as well. In a given memory array (e.g., within a given tier) any number of TFT structures may be arranged such that wordlines are used to connect rows of TFT structures via their gate electrodes and bitlines are used to connect columns of TFT structures via one of their source or drain contacts.

According to some embodiments, any number of tiers may be formed in the interconnect region, with each tier having an array of 1T-1C memory structures. In one such example, a given memory cell of the array includes a TFT operatively coupled with a capacitor-over-bitline (COB). In general, the TFTs (or access devices) of higher tiers of memory arrays may be formed to be more conductive or have a lower threshold voltage compared to lower tiers. Increasing the conductivity (or lowering threshold voltage) of higher tiers may be performed in any number of ways. In one example, the dopant concentration of certain elements within the semiconductor region is either increased or decreased depending on the semiconductor material being used. For example, semiconductor regions that include indium, gallium, and zinc oxide (InGaZnO or IGZO) may be formed to have a higher oxygen concentration (e.g., higher number of oxygen vacancies) in higher tiers, a higher indium concentration in higher tiers, and/or a lower gallium concentration in higher tiers. In another example, various dopants can be added to the semiconductor regions of TFT structures to either increase or decrease conductivity. For example, elements like nitrogen, helium, and carbon can be added to the semiconductor regions of TFT structures in lower tiers to lower their conductivity while elements like hydrogen, fluorine, and chlorine can be added to the semiconductor regions of TFT structures in higher tiers to increase their conductivity. In another example, the semiconductor regions of TFT structures in higher tiers may be made thicker or have a greater width than the semiconductor regions of TFT structures in lower tiers. In another example, different work function metal materials may be added to the gate electrode of TFT structures of upper or lower tiers to affect the threshold voltage. For example, gate electrodes of TFT structures in upper tiers may include more p-type work function metals such as titanium, titanium nitride, tantalum, or tantalum nitride while gate electrodes of TFT structures in lower tiers may include more n-type work function metals such as platinum, gold, palladium, or cobalt. In another example, the gate dielectric layers of TFT structures in upper tiers may be made thinner compared to the gate dielectric layers of TFT structures in lower tiers. In another example, contacts of TFT structures in upper tiers may be made wider or have a higher contact area (with respect to the channel layer) compared to contacts of TFT structures in lower tiers. In another example, contacts of TFT structures in upper tiers may include more metal compared to contacts of TFT structures in lower tiers. In another example, the memory structure arrays of upper tiers may be smaller than the memory structure arrays of lower tiers. In any such cases, note that the grading can be interpolative in nature. Furthermore, any of the aforementioned examples can be combined to change various characteristics of the TFT structures across different tiers.

Just as access device (e.g., TFT) features can be graded, so too can storage device (e.g., capacitor) features. For example, according to some embodiments, the capacitors formed across different tiers may have their characteristics altered to affect the performance of the memory structures, which may be done in conjunction with TFT feature grading or without TFT feature grading. There is a strong correlation between the capacitance and signal delay, with a signal time constant ($\tau$) being roughly equal to R*C. Accordingly, as either the resistance or capacitance increases, so does the time delay. According to some embodiments, one or more characteristics of the capacitors formed in successively higher tiers can be changed to lower the capacitance and in turn reduce the signal delay (or at least compensate for an increase in resistance). In one example, capacitors of higher tiers may be made smaller (e.g., less area between the electrodes). In another example, capacitors of higher tiers may include a thicker dielectric between the electrodes. In another example, capacitors of higher tiers may include different dielectric materials between the electrodes that have a lower dielectric constant ($\varepsilon$).

According to an embodiment, an integrated circuit includes a device layer including a plurality of semiconductor devices. An interconnect structure is above the device layer and includes a plurality of interconnect layers. A multi-tier memory structure is within the interconnect structure, and includes a first tier and a second tier above the first tier. The first tier includes first memory cells and the second tier includes second memory cells, the first memory cells including first transistors and first capacitors, and the second memory cells including second transistors and second capacitors. At least one transistor characteristic or capacitor characteristic of the first memory cells is graded with respect to that at least one characteristic of the second memory cells.

According to another embodiment, an integrated circuit includes a plurality of semiconductor devices and an interconnect region above the plurality of semiconductor devices and having a plurality of stacked interconnect layers. A first thin film transistor (TFT) structure within a first interconnect layer of the plurality of stacked interconnect layers includes a first gate electrode, a first gate dielectric on the first gate electrode, a first semiconductor region on the first gate dielectric, and first and second conductive contacts that each contact a respective portion of the first semiconductor region. A second thin film transistor (TFT) structure is in a second interconnect layer of the plurality of stacked interconnect layers, the second interconnect layer being over the first interconnect layer. The second TFT structure includes a second gate electrode, a second gate dielectric on the second gate electrode, a second semiconductor region on the second gate dielectric, and third and fourth conductive contacts that each contact a respective portion of the second semiconductor region. The first semiconductor region has a lower concentration of oxygen or sulfur vacancies compared to the second semiconductor region and/or a first cross-sectional area of contact between the first and second conductive contacts and the first semiconductor region is less than a second cross-sectional area of contact between the third and fourth conductive contacts and the second semiconductor region.

According to another embodiment, an integrated circuit includes a plurality of semiconductor devices and an interconnect region above the plurality of semiconductor devices and having a plurality of stacked interconnect layers. The integrated circuit also includes a first TFT structure within a first interconnect layer of the plurality of stacked interconnect layers, a first MIM capacitor coupled to a first contact of the first TFT structure, a second TFT structure within a second interconnect layer of the plurality of stacked interconnect layers, and a second MIM capacitor coupled to a second contact of the second TFT structure. The second interconnect layer is over the first interconnect layer and the first MIM capacitor has a larger capacitance compared to the second MIM capacitor.

According to another embodiment, an integrated circuit includes a plurality of semiconductor devices and an interconnect region above the plurality of semiconductor devices and having a plurality of stacked interconnect layers. The integrated circuit further includes a first thin film transistor (TFT) structure within a first interconnect layer of the plurality of stacked interconnect layers where the first TFT structure has a first semiconductor region on a first gate dielectric, and a second TFT structure within a second interconnect layer of the plurality of stacked interconnect layers where the second TFT structure has a second semiconductor region on a second gate dielectric. The second interconnect layer is over the first interconnect layer. The first semiconductor region has at least one of a lower concentration of oxygen or sulfur vacancies, a higher concentration of gallium, a lower concertation of indium, a higher concentration of nitrogen, a lower width, or a lower thickness compared to the second semiconductor region.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate systematic geometric or material changes made to memory structure features of different tiers, such changes being recognizable as gradients. For example, the gate dielectric thickness or semiconductor region thickness may become successively thinner or thicker for higher tiers. In some other examples, material composition of the semiconductor region, gate electrode, or contacts can exhibit higher or lower concentrations of certain elements for higher tiers.

It should be readily understood that the meaning of "above" and "over" in the present disclosure should be interpreted in the broadest manner such that "above" and "over" not only mean "directly on" something but also include the meaning of over something with an intermediate feature or a layer therebetween. The meaning of "on" or "directly on" in the present disclosure should be interpreted to mean something that is on something else with no intermediate feature or layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The integrated circuit or structure may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. Example layers include, for instance, a liner or barrier layer (e.g., a relatively thin layer of tantalum nitride), an etch stop layer (e.g., a relatively thin layer of silicon nitride), an interconnect layer (e.g., a relatively thick layer that includes dielectric material and one or more conductive interconnect features and/or active devices and/or passive devices), and a device layer (e.g., a relatively thick layer that includes metal oxide semiconductor field effect transistors or MOSFETs along with dielectric materials and conductive materials).

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross-sectional view that illustrates an example portion of an integrated circuit having an interconnect region 103 above a device region 101 that includes a plurality of semiconductor devices 104, in accordance with an embodiment of the present disclosure. The semiconductor devices 104 in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made). The semiconductor devices 104 may be configured for any number of functions, such as logic or compute transistors, I/O transistors, access or switching transistors, and/or radio frequency (RF) transistors, to name a few examples.

According to some embodiments, in addition to semiconductor devices 104, device region 101 may include, for example, one or more other layers or structures associated with the semiconductor devices 104. For example, device region 101 can also include a substrate 102 and one or more dielectric layers 106 that surround active and/or conductive portions of the semiconductor devices 104. Device region 101 may also include one or more conductive contacts 108 that provide electrical contact to transistor elements such as gate structures, drain regions, or source regions. Conductive contacts 108 may include, for example, tungsten, ruthenium, or copper, although other metal or metal alloy materials may be used as well. Some embodiments may include a local interconnect (e.g., via or line) that connects a given contact 108 to an interconnect feature within the interconnect region 103.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material from and/or upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers. The techniques provided herein may be used to provide multi-tier memory structures within frontside and/or backside interconnect structures, as will be appreciated.

Interconnect region 103 includes any number (n) of interconnect layers 110-1 to 110-n stacked over one another. Each interconnect layer can include a dielectric material 112 along with one or more different conductive interconnect features (e.g., vias and lines), active devices (e.g., transistors, diodes), and/or passive devices (e.g., capacitors, resistors, inductors). Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive interconnect features can include any number of conductive traces 114 and conductive vias 116 arranged in any pattern across the interconnect layers 110-1 to 110-n to carry signal and/or power voltages to/from the various semiconductor devices 104. As used herein, conducive vias, such as conductive via 116, extend at least partially through an interconnect layer to connect between conductive traces on an upper interconnect layer and/or a lower interconnect layer, while conductive contacts, such as conductive contact 108, extend at least partially through a portion of dielectric layer 106 or any interconnect layer to contact one or more transistor elements. Interconnect layers are sometimes called metallization layers (e.g., such as M0 through M15). In some embodiments, a given metallization layer may include two adjacent interconnect layers with vias in one of the layers and metal traces in the other of the two layers.

Any of conductive traces 114 and conductive vias 116 can include any number of conductive materials, with some examples including copper, ruthenium, tungsten, cobalt, molybdenum, titanium, tantalum, and alloys thereof. In some example cases, any of conductive traces 114 and conductive vias 116 include a relatively thin liner or barrier, such as manganese, ruthenium, titanium nitride, titanium silicide, tungsten carbo-nitride (WCN), physical vapor deposited (PVD) or ALD tungsten, tantalum, or tantalum nitride, to name a few examples.

Note that each of the various conductive vias 116 and conductive contacts 108 are shown with tapered profiles to indicate a more natural appearance due to the etching process used to form the openings, although such tapering may not always be present. Any degree of tapering may be observed depending on the etch parameters used and the thickness of the dielectric layer being etched through. Furthermore, conductive vias may be stacked one over the other through different dielectric layers of interconnect region 103. However, in some examples, a single via recess may be formed through more than one dielectric layer yielding a taller, more tapered conductive via that extends through two or more dielectric layers (e.g., a deep via or supervia).

As can be further seen in this example embodiment, interconnect region 103 also includes tiers of memory arrays 118-1-118m, with each of the m memory arrays having any number of backend memory structures and/or capacitors. Each of the memory arrays may extend vertically across any number of interconnect layers (e.g., one, two or many). In some embodiments, a given memory array 118-1 includes a plurality of TFT structures 120 formed over a given conductive trace, such as conductive trace 114, extending in a first direction. According to some embodiments, a conductive via 122 extends between each TFT structure 120 along the illustrated row of TFT structures and conductive trace 114. In some other embodiments, the TFT structures 120 along the same row sit directly on conductive trace 114.

One or more second conductive traces 124 may each couple to a corresponding contact of a given TFT structure 120. Second conductive traces 124 may extend in a second direction orthogonal to the first direction. Conductive trace 114 may be, for example, a wordline of several parallel wordlines that extend beneath any number of TFT structures 120. Second conductive traces 124 may represent, for example, parallel bitlines extending into and out of the page and each connecting to the contacts of any number of TFT structures 120. TFT structures 120 can include any number of layers to form a transistor with a first source or drain region coupled to a corresponding second conductive trace 124 and a second source or drain region coupled to a conductive via 126. According to some embodiments, conductive via 126 acts as a conductive bridge between the second source or drain contact of a given TFT structure 120 and an electrode of its associated capacitor 128. Capacitors 128 may be, for example, metal-insulator-metal (MIM) capacitors having a U-shaped cross-section as shown, although other capacitor structures may be used as well (e.g., pillar-based capacitors with a dielectric layer sandwiched between an inner conductive core and an outer conductive layer, flat capacitors with a dielectric layer sandwiched between upper and lower conductive layers or between left and right conductive layers). Each capacitor 128 in tandem with its associated TFT structure 120 represents a single TFT memory structure or memory cell for holding a single bit (e.g., a logic zero or one depending on the charge state of capacitor 128). This example shows TFT structure 120 contained within a single interconnect layer, but other embodiments may have TFT structures that extend vertically through two or more such interconnect layers. Further note that, in some embodiments, there is a relatively thin etch stop layer between adjacent interconnect layers, such as between any adjacent interconnect layers 110. Such etch stops may have a thickness in the range of, for example, 2 nm to 10 nm, and may include, for instance, silicon nitride, silicon oxynitride, or silicon oxycarbonitride, to name few examples.

As discussed above, the TFT structures 120 and/or capacitors 128 exhibit different geometries and/or material properties in successively higher tiers (e.g., up to memory array 118m), according to some embodiments. In some cases, the changes made to the structures of successively higher tiers are done to raise their conductivity to counteract the changes in the conductivity of lower tiers caused by fabrication processes. According to some embodiments, the difference in the measured contact resistance between the memory structures of any tier vs any other tier is less than 10% due to the changes made to the structures through the various tiers. Similarly, and according to some embodiments, the difference in the measured semiconductor region resistance between the memory structures of any tier vs any other tier is less than 10% due to the changes made to the structures through the various tiers. Likewise, and according to some embodiments, the difference in the measured capacitor values between the memory structures of any tier vs any other tier is less than 10% due to the changes made to the structures through the various tiers. All of the various structural and/or material changes made between different tiers of memory arrays will be discussed in more detail when discussing the fabrication process for a given TFT memory structure with respect to FIGS. 2A-2J.

Figure 1B:
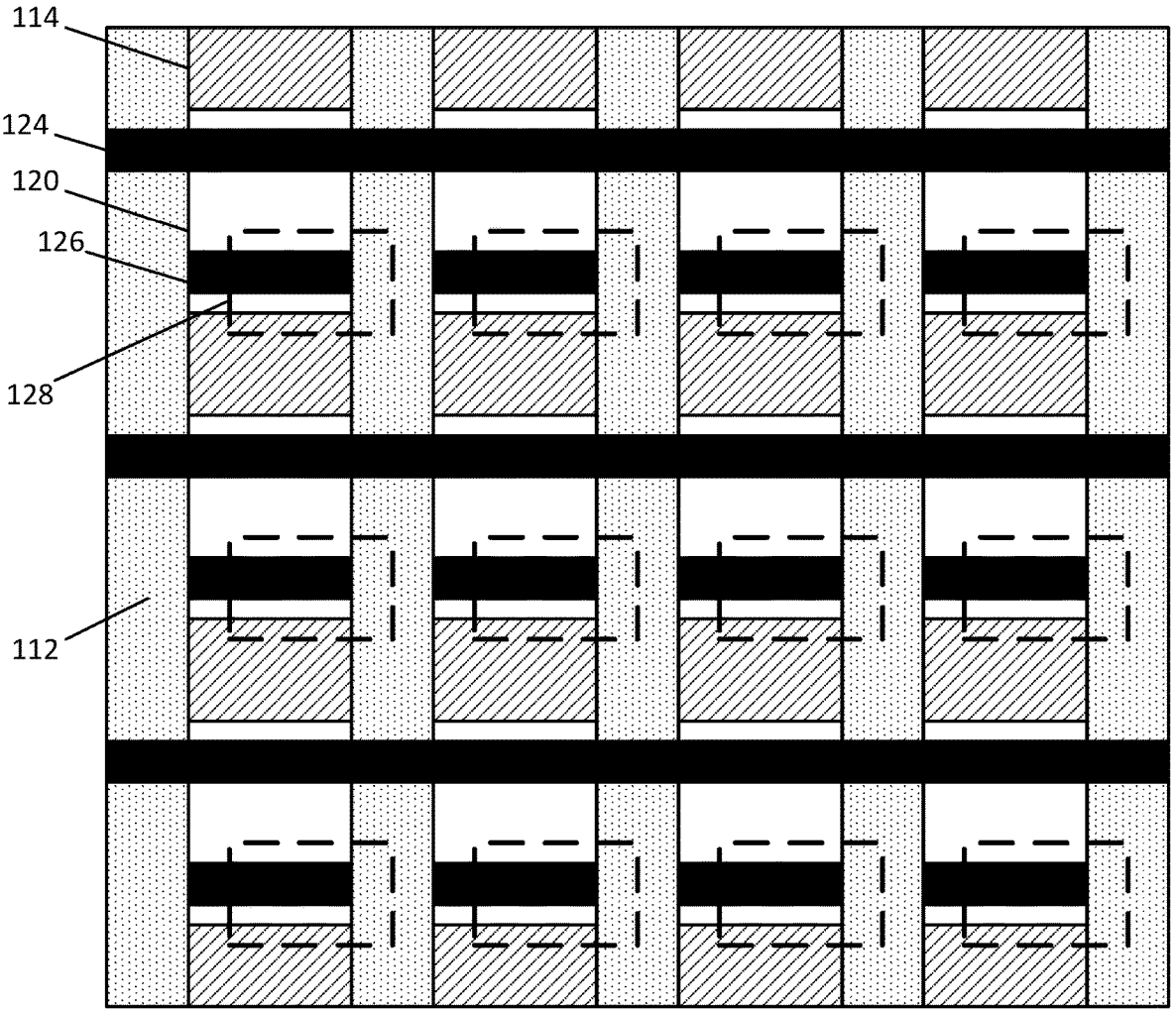
FIG. 1B is a plan view of an array of memory structures and generally illustrates structures formed across different interconnect layers, in accordance with an embodiment of the present disclosure.

FIG. 1B illustrates a plan view across an array of TFT memory structures, according to an embodiment. Many of the illustrated structures are located on or across different interconnect layers as shown in FIG. 1A but are all shown together in a single view in FIG. 1B for clarity. A plurality of parallel conductive traces 114 are present within a first interconnect layer and surrounded by dielectric material 112 within the first interconnect layer. Note in this view that the conductive traces 114 each run from the top to the bottom of the page (or vice-versa). According to some embodiments, dielectric material 112 is also present between any other structures on other interconnect layers, such as between adjacent TFT structures 120 and/or between adjacent capacitors 128.

TFT structures 120 are formed as individual islands in an array across the plurality of conductive traces 114, according to some embodiments. In this way, conductive traces 114 act as wordlines with each conductive trace 114 coupled to the gate(s) of one or more TFT structures 120 arranged along its length. In this example view, there are four conductive traces 114 shown, and there are three TFT structures 120 along the length of each conductive trace 114.

According to some embodiments, one of the source or drain contacts of TFT structures 120 in a same row are coupled to a same second conductive trace 124 that extends in a different direction (e.g., orthogonally) compared to conductive trace 114. A plurality of parallel second conductive traces 124 may each extend across any number of TFT structures and be coupled to the source or drain contact on each of the TFT structures in the row. In this example view, there are three conductive traces 124 shown, and there are four TFT structures 120 along the length of each conductive trace 124. Accordingly, any given TFT structure 120 of the array has its gate coupled to one of the conductive traces 114 (e.g., wordline) and one of its source or drain contacts coupled to one of the second conductive traces 124 (e.g., bitline) such that each of the TFT structures are individually addressable, in some examples. The other source or drain contact on each TFT structure 120 is coupled to its own conductive via 126, which acts like a conductive bridge between the TFT structure 120 and its corresponding capacitor 128. In an embodiment, TFT structures 120 are formed in a second interconnect layer over the first interconnect layer, second conductive traces 124 and conductive vias 126 are formed in a third interconnect layer over the second interconnect layer, and capacitors 128 are formed in a fourth interconnect layer over the third interconnect layer. In some other embodiments, note that one or more of TFT structures 120 may be a dummy structure (e.g., not connected into a working memory cell or otherwise non-functional).

Fabrication Methodology

FIGS. 2A-2J are cross-sectional views that collectively illustrate an example process for forming a portion of an interconnect region of an integrated circuit. According to an embodiment, the fabrication process for forming a 1T-1C memory structure in the interconnect region is provided. Each figure shows an example structure that results from the process flow up to that point in time, so the depicted structure evolves as the process flow continues, culminating in the structure shown in FIG. 2J, which provides a detailed view of a single example TFT memory structure. The TFT memory structure may be one structure of a plurality of TFT memory structures across an array of memory structures (e.g., a single tier of memory structures). Each structure in the array may be formed together using the processes detailed here. Furthermore, as noted above, multiple tiers of memory arrays may be formed in the interconnect region. The TFT memory structures of each tier are formed using the same general processes discussed here, but with differing geometrical or material features.

The TFT memory structure may be part of an overall integrated circuit (e.g., such as a processor or memory chip, or a system-on-chip) that includes, for example, digital logic cells and/or memory cells and analog mixed signal circuitry. Example materials and process parameters are given, but other materials or parameters will be appreciated in light of this disclosure.

Figure 2A:
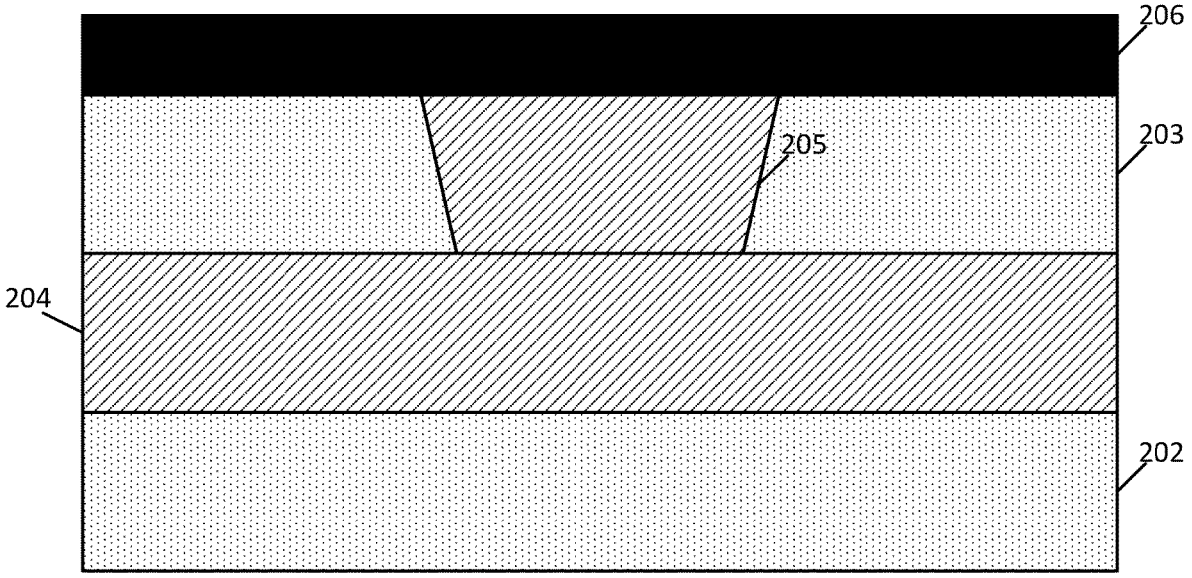
FIGS. 2A-2J are cross-sectional views that collectively illustrate an example process for forming a thin film transistor (TFT) memory structure, in accordance with an embodiment of the present disclosure.

FIG. 2A is a cross-sectional view taken through some interconnect layers of a plurality of stacked interconnect layers. Accordingly, any number of lower interconnect layers 202 may be at any position within interconnect region 103. Interconnect layers 202 may include any conductive traces and/or vias within any number of dielectric layers. According to some embodiments, a first interconnect layer includes a first conductive trace 204. As discussed above, first conductive trace 204 may be one wordline of a plurality of wordlines that run parallel to one another in the first interconnect layer. Other memory control/access schemes can be used as well.

First conductive trace 204 may be formed, for example, by first forming a recess within a surrounding dielectric layer (not shown) followed by filling the recess with a conductive material, such as copper, that is deposited using any one of electroplating, electroless plating, CVD, or PECVD, to name a few examples. After deposition of the conductive material within the recess, a polishing process may be performed using, for example, chemical mechanical polishing (CMP) to planarize the given layer down to a top surface of first conductive trace 204. In some embodiments, a thin barrier layer is conformally deposited (e.g., via ALD or CVD) first along the inner surfaces of the recess prior to the deposition of the copper or other conductive fill material. The thin barrier layer may include, for example, tantalum or titanium, or a nitride of these, or some other electromigration inhibitor.

According to some embodiments, another dielectric layer 203 is deposited over first conductive trace 204, and a conductive via 205 is formed within dielectric layer 203 such that conductive via 205 is on first conductive trace 204. In some embodiments, conductive via 205 is one via of a plurality of such conductive vias formed within dielectric layer 203 along a length of first conductive trace 204 and along a length of other such conductive traces parallel to first conductive trace 204.

According to some embodiments, a gate electrode 206 is deposited on dielectric layer 203 and a top surface of conductive via 205. In some other embodiments, dielectric layer 203 is omitted such that gate electrode 206 is deposited directly on first conductive trace 204. In either case, gate electrode 206 is conductively coupled to first conductive trace 204 (either directly or through conductive via 205). As will be appreciated, this particular example refers to a backside-gate configuration, where the gate structure of the access device being formed is on a backside of the device, and the source and drain contacts of that device are on a frontside of the device. Such a configuration facilitates connectivity within a given memory array (e.g., sandwiching a TFT device between a wordline and a bitline), but other connectivity schemes may be used if device density constraints allow for same.

Gate electrode 206 may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. Note that gate electrode 206 may contain multiple layers, such as an inner plug or fill metal, with surrounding or outer work function material. According to some embodiments, gate electrode 206 includes one or more n-type work function metals or p-type work function metals depending on the tier in which it is being fabricated. For example, lower tiers may use more n-type work function metals compared to higher tiers, and higher tiers may use more p-type work function metals. In one example, a first tier of memory structures has gate electrodes that include platinum, gold, palladium, or cobalt while a highest tier of memory structures has gate electrodes that include titanium, titanium nitride, tantalum, or tantalum nitride. Tiers in between the lowermost and uppermost tiers may exhibit a gradient change of such materials, such that the n-type metals have their highest concentration in the lowermost tier and have linearly or interpolatively decreasing concentration in successively higher tiers, with the uppermost tier having a zero-concentration or an otherwise relatively lowest concentration of n-type metal. Likewise, the p-type metals may have their highest concentration in the uppermost tier and have linearly or interpolatively decreasing concentration in successively lower tiers, with the lowermost tier having a zero-concentration or an otherwise relatively lowest concentration of p-type metal. Note, however, that linear or interpolative grading is not required; rather, the change from tier to tier can be inconsistent or otherwise non-linear. Further note that the minimum to maximum spread for a given parameter may be relatively small, but still allow for grading upwards or downward between the max and min values. For instance, according to some embodiments, the different work function metals may be included in gate electrodes of different tiers such that the work function difference of the gate electrodes between any two tiers is less than 0.1 EV. In one example, the work function difference between the gate electrodes on the uppermost tier and the gate electrodes on the lowermost tier is about 0.1 EV or less. Table 1 shows one such example of a five-tier memory, with the percentage x or y referring to the amount of the given work function material relative to the entirety of the gate electrode, or some other consistently applied quantification of work function material types.

TABLE 1

| Example of graded work function (WF) material | | |
| --- | --- | --- |
| tier | p-type WF concentration x | n-type WF concentration y |
| 1 (lowest) | 0% ≤ x < 20% | 80% ≤ x ≤100% |
| 2 | 20% ≤ x < 40% | 60% ≤ x < 80% |
| 3 | 40% ≤ x < 60% | 40% ≤ x < 60% |
| 4 | 60% ≤ x < 80% | 20% ≤ x < 40% |
| 5 (highest) | 80% ≤ x ≤ 100% | 0% ≤ x < 20% |

Figure 2B:
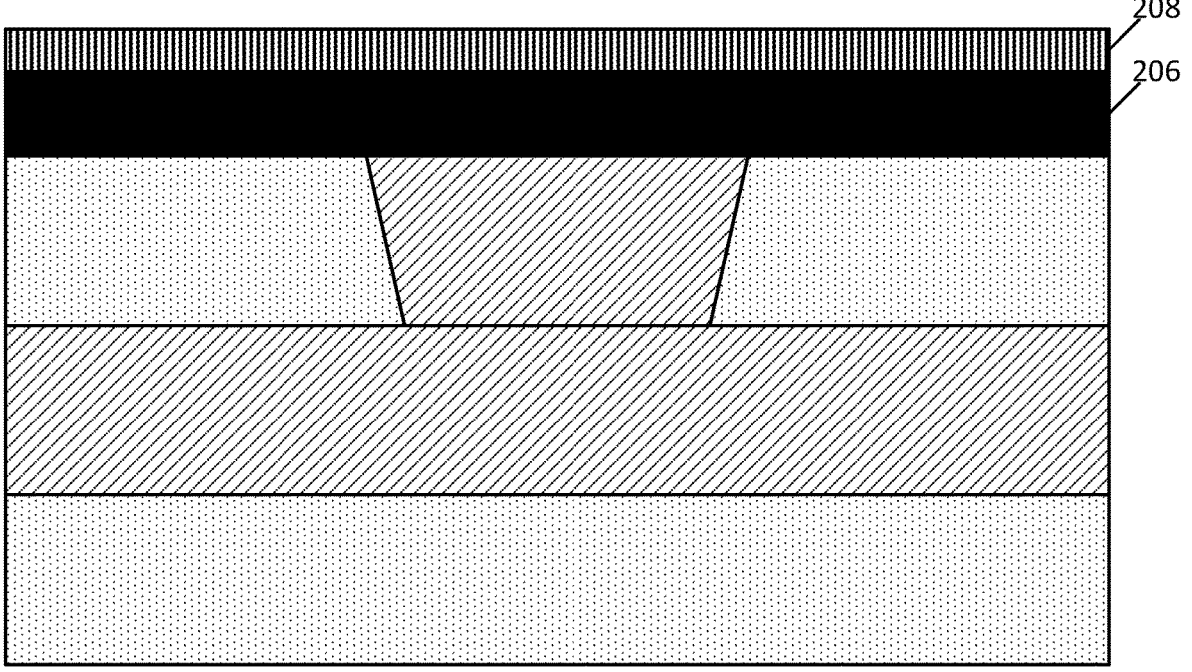

FIG. 2B is a cross-sectional view of the structure depicted in FIG. 2A after formation of a gate dielectric 208 over gate electrode 206. Gate dielectric 208 may be deposited, for example, to a thickness between about 2 nm and about 10. In some embodiments, gate dielectric 208 has a thickness up to about 50 nm. Gate dielectric 208 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, gate dielectric 208 may include multiple layers, such as a first layer of high-k material (e.g., hafnium oxide) on the gate electrode 206 and a second layer of lower-k oxide between the first layer and the channel layer that is ultimately formed over gate dielectric 208. The lower-k oxide may be, for instance, silicon oxide or an oxide of the channel layer material.

According to some embodiments, the thickness of gate dielectric 208 changes depending on the tier in which it is located. Note that the thickness includes any and all layers making up that gate dielectric. For example, higher tiers of TFT memory structures may have a thinner gate dielectric 208. According to some embodiments, the difference between the gate dielectric thickness of the TFT memory structures between any two tiers is less than 10 nm, less than 5 nm, or less than 0.5 nm. In one example, the difference between the gate dielectric thickness of the TFT memory structures between the uppermost tier and the lowermost tier is about 10 nm (e.g., gate dielectric thickness of uppermost tier is about 0.1 nm and gate dielectric thickness of lowermost tier is about 10 nm). Table 2 shows two such examples (Ex. A and Ex. B) of a five tier memory. As can be seen in Example A, the change from tier to tier is linear and consistent (about a 2 nm change between adjacent tiers), while in Example B the change from tier to tier is non-linear or otherwise inconsistent (about a 2 nm change between adjacent tiers 1 through 4, and about a 1 nm change between tiers 4 and 5).

TABLE 2

Example of graded gate dielectric thickness

| tier | Ex. A: gate dielectric thickness | Ex. B: gate dielectric thickness |
|------|------|------|
| 1 (lowest) | 10 nm | 8 nm |
| 2 | 8 nm | 6 nm |
| 3 | 6 nm | 4 nm |
| 4 | 4 nm | 2 nm |
| 5 (highest) | 2 nm | 1 nm |

Figure 2C:
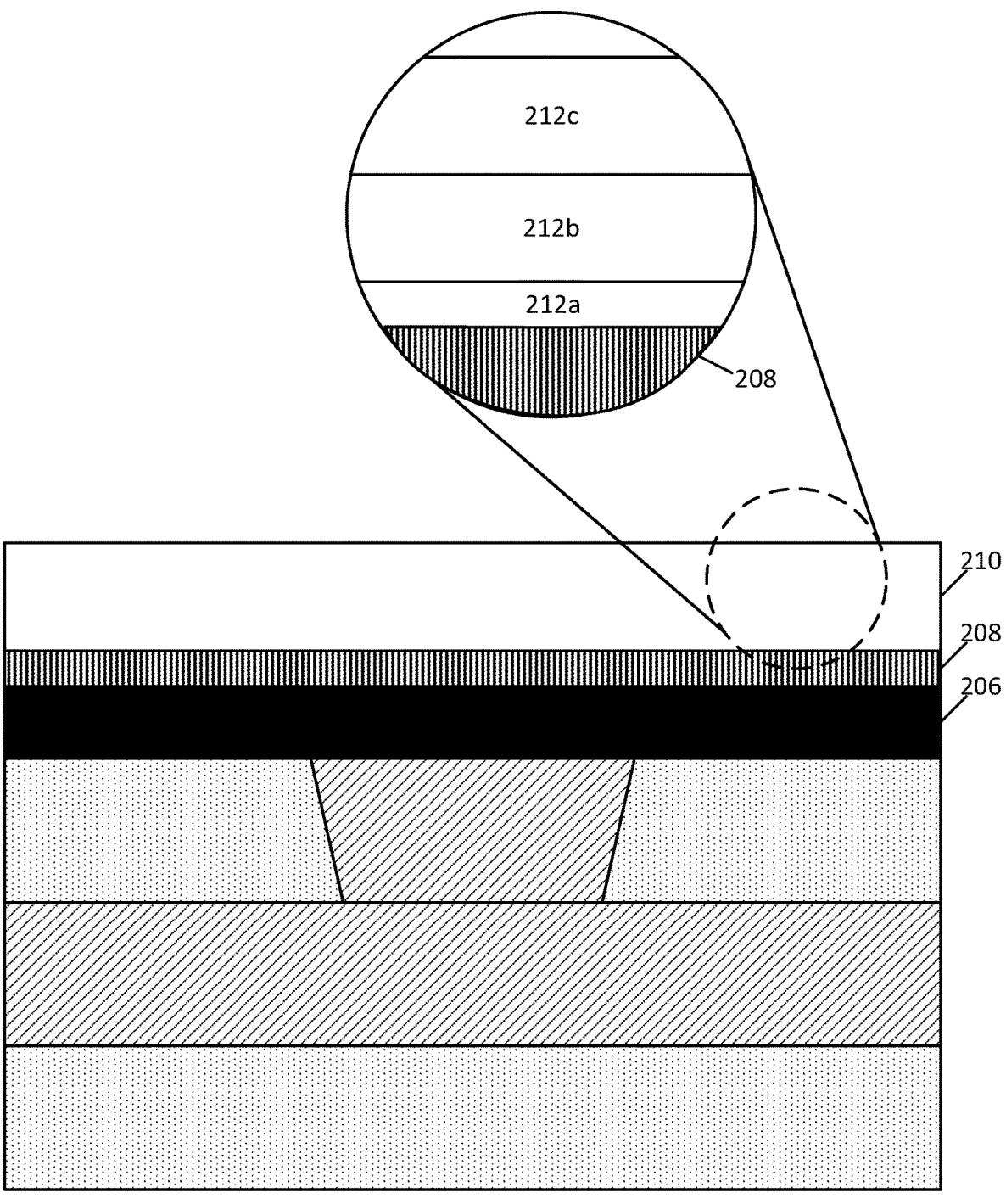

FIG. 2C is a cross-sectional view of the structure depicted in FIG. 2B after the formation of a semiconductor region 210 (also referred to as a channel layer or channel region) over gate dielectric 208. Semiconductor region 210 may include any suitable semiconductor material, such as silicon or any III-V or II-VI materials exhibiting semiconducting qualities. According to some embodiments, semiconductor region 210 includes any of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$ (silicon-boron-nitrogen), stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (sometimes referred to as c-IGZO), gallium zinc oxynitride (GaZnON), zinc oxynitride (ZnON), molybdenum and sulfur, a group-VI transition metal dichalcogenide, or a c-axis aligned crystal (CAAC) layer.

According to some embodiments, semiconductor region 210 may include different concentrations of its semiconductor material elements depending on the tier in which it is located. For example, higher tiers of TFT structures may include a higher percentage of oxygen vacancies (e.g., higher concentration of oxygen) or sulfur vacancies (e.g., higher concentration of sulfur). In another example, higher tiers of TFT structures may include a lower percentage of wide bandgap materials (e.g., indium). In another example, higher tiers of TFT structures may include a higher percentage of high mobility materials (e.g., gallium). Tiers in between the lowermost and uppermost tiers may exhibit a gradient change of such materials. In one particular example, semiconductor regions 210 within TFT structures across multiple tiers that include indium gallium zinc oxide (IGZO) have interpolatively or otherwise successively higher concentrations of oxygen in successively higher tiers, successively lower concentrations of gallium in successively higher tiers, and successively higher concentrations of indium in successively higher tiers. In another example, semiconductor regions 210 within TFT structures across multiple tiers that include polysilicon have successively higher n-type or p-type dopant concentrations in successively higher tiers. Table 3 shows one such example of a five tier memory, with the percentage x referring to the amount of amount of vacancies relative to all possible vacancies of the channel layer, and with the percentage y or z referring to the amount of a given channel material relative to the entirety of the channel layer. Other consistently applied quantifications of vacancies, high bandgap materials, and high mobility materials can be used as well.

TABLE 3

Example of graded $O_2$ or $S_2$ vacancies, high bandgap (BG), high mobility

| tier | high $O_2$ or $S_2$ vacancies x | high BG conc y | high mobility conc z |
|------|------|------|------|
| 1 (lowest) | 80% ≤ x ≤ 100% | 0% ≤ y < 20% | 80% ≤ x ≤ 100% |
| 2 | 60% ≤ x < 80% | 20% ≤ y < 40% | 60% ≤ x < 80% |
| 3 | 40% ≤ x < 60% | 40% ≤ y < 60% | 40% ≤ x < 60% |
| 4 | 20% ≤ x < 40% | 60% ≤ y < 80% | 20% ≤ x < 40% |
| 5 (highest) | 0% ≤ x < 20% | 80% ≤ y ≤ 100% | 0% ≤ x < 20% |

According to some embodiments, semiconductor region 210 includes various other dopant elements depending on the tier in which it is located. For example, lower tiers of TFT structures may include semiconductor regions with a higher concentration of elements that generally reduce conductivity, such as nitrogen, helium, and carbon. Similarly, higher tiers of TFT structures may include semiconductor regions with a higher concentration of elements that generally increase conductivity, such as hydrogen, fluorine, and chlorine. Tiers in between the lowermost and uppermost tiers may exhibit a gradient change of such materials, such that the elements that generally reduce conductivity (e.g., N, He, and C) have their highest concentration in the lowermost tier and have decreasing concentration in successively higher tiers, with the uppermost tier having a zero-concentration or an otherwise relatively lowest concentration of such elements. Likewise, elements that generally increase conductivity (e.g., H, Fl, and Cl) may have their highest concentration in the uppermost tier and have decreasing concentration in successively lower tiers, with the lowermost tier having a zero-concentration or an otherwise relatively lowest concentration of conductivity-increasing elements. Table 4 shows one such example of a five tier memory, with the percentage x or y referring to the amount of conductivity-increasing material or conductivity-decreasing material relative to the entirety of the given channel layer, or some other consistently-applied quantification of conductivity-increasing material or conductivity-decreasing material.

TABLE 4

| | Example of graded conductivity increasing/decreasing material | |
| tier | conductivity-increasing concentration x | conductivity-decreasing concentration y |
| --- | --- | --- |
| 1 (lowest) | $0\% \leq x < 20\%$ | $80\% \leq x \leq 100\%$ |
| 2 | $20\% \leq x < 40\%$ | $60\% \leq x < 80\%$ |
| 3 | $40\% \leq x < 60\%$ | $40\% \leq x < 60\%$ |
| 4 | $60\% \leq x < 80\%$ | $20\% \leq x < 40\%$ |
| 5 (highest) | $80\% \leq x \leq 100\%$ | $0\% \leq x < 20\%$ |

According to some embodiments, the aforementioned dopants to either increase or decrease conductivity are not evenly distributed across a thickness of any one semiconductor region 210. For example, such dopants may be concentrated primarily at a top surface of semiconductor region 210 (e.g., the surface opposite the surface adjacent to gate dielectric 208. In some examples, the dopants concentrated primarily at a top surface of semiconductor region 210 may be different between different tiers of TFT structures. Note, however, that the semiconductor region 210 dopants can still be graded from one tier to the next, even when they have such an uneven distribution within any one semiconductor region 210. The dopant concentration in any given semiconductor region may be between about $1\times10^{13}/cm3$ and $1\times10^{24}/cm3$.

According to some embodiments, the thickness of semiconductor region 210 changes depending on the tier in which it is located. For example, higher tiers of TFT memory structures may have thicker semiconductor regions 210. According to some embodiments, the difference between the semiconductor region thickness of the TFT memory structures on the lowermost and uppermost tiers is between 10 nm and 20 nm. The total thickness of any of the semiconductor regions 210 on any tier may be between about 1 nm and about 100 nm. As previously noted, the difference between the min and max values (in this case, channel thickness) may be relatively small (e.g., about 10 nm) or relatively large (e.g., about 50 nm), and the changes from tier to tier need not be consistent. Table 5 shows one such example of a five tier memory, with the percentage x or y referring to the amount of conductivity-increasing material or conductivity-decreasing material relative to the entirety of the given channel layer, or some other consistently-applied quantification of conductivity-increasing material or conductivity-decreasing material.

TABLE 5

| | Example of graded channel thickness |
| tier | semiconductor region thickness |
| --- | --- |
| 1 (lowest) | 4 nm |
| 2 | 6 nm |
| 3 | 10 nm |
| 4 | 13 nm |
| 5 (highest) | 16 nm |

According to some embodiments, semiconductor region 210 includes a plurality of deposited semiconductor layers. In one example, semiconductor region 210 includes three layers: a first semiconductor layer 212a, a second semiconductor layer 212b, and a third semiconductor layer 212c. The preceding description regarding elemental composition of semiconductor region 210 may equally apply to any one of first semiconductor layer 212a, second semiconductor layer 212b, or third semiconductor layer 212c. In some embodiments, first semiconductor layer 212a is thinner than both second semiconductor layer 212b and third semiconductor layer 212c. In some embodiments, for example, first semiconductor layer 212a has a thickness between about 0.5 nm and about 1.5 nm, second semiconductor layer 212b has a thickness between about 0.5 nm and about 15 nm or even up to about 50 nm, and third semiconductor layer 212c has a thickness between about 0.5 nm and about 50 nm.

Figure 2D:
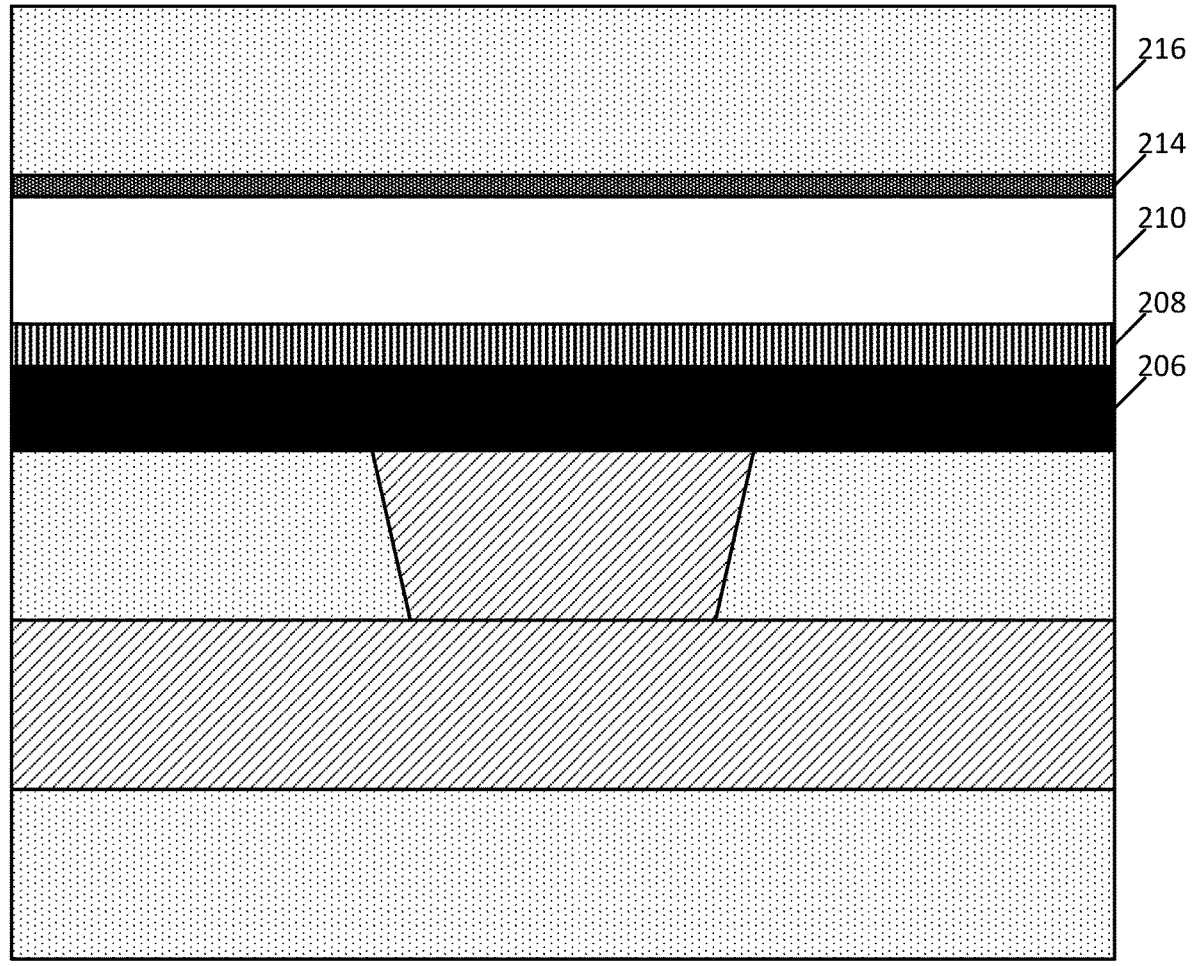

FIG. 2D is a cross-sectional view of the structure depicted in FIG. 2C after forming a passivation layer 214 and dielectric layer(s) 216. According to some embodiments, passivation layer 214 includes a dielectric material that protects the underlying semiconductor region 210. Passivation layer 214 may include, for example, aluminum oxide, although other metal oxides may be used as well. Dielectric layer(s) 216 represent any number of passivation and/or interlayer dielectrics (ILD) deposited over passivation layer 214. According to some embodiments, dielectric layer(s) 216 include the same material composition as dielectric material 112 in any interconnect layer. Dielectric layer(s) 216 may include, for instance, silicon oxide, silicon oxycarbide, silicon nitride, or silicon oxynitride, to name a few examples.

Figure 2E:
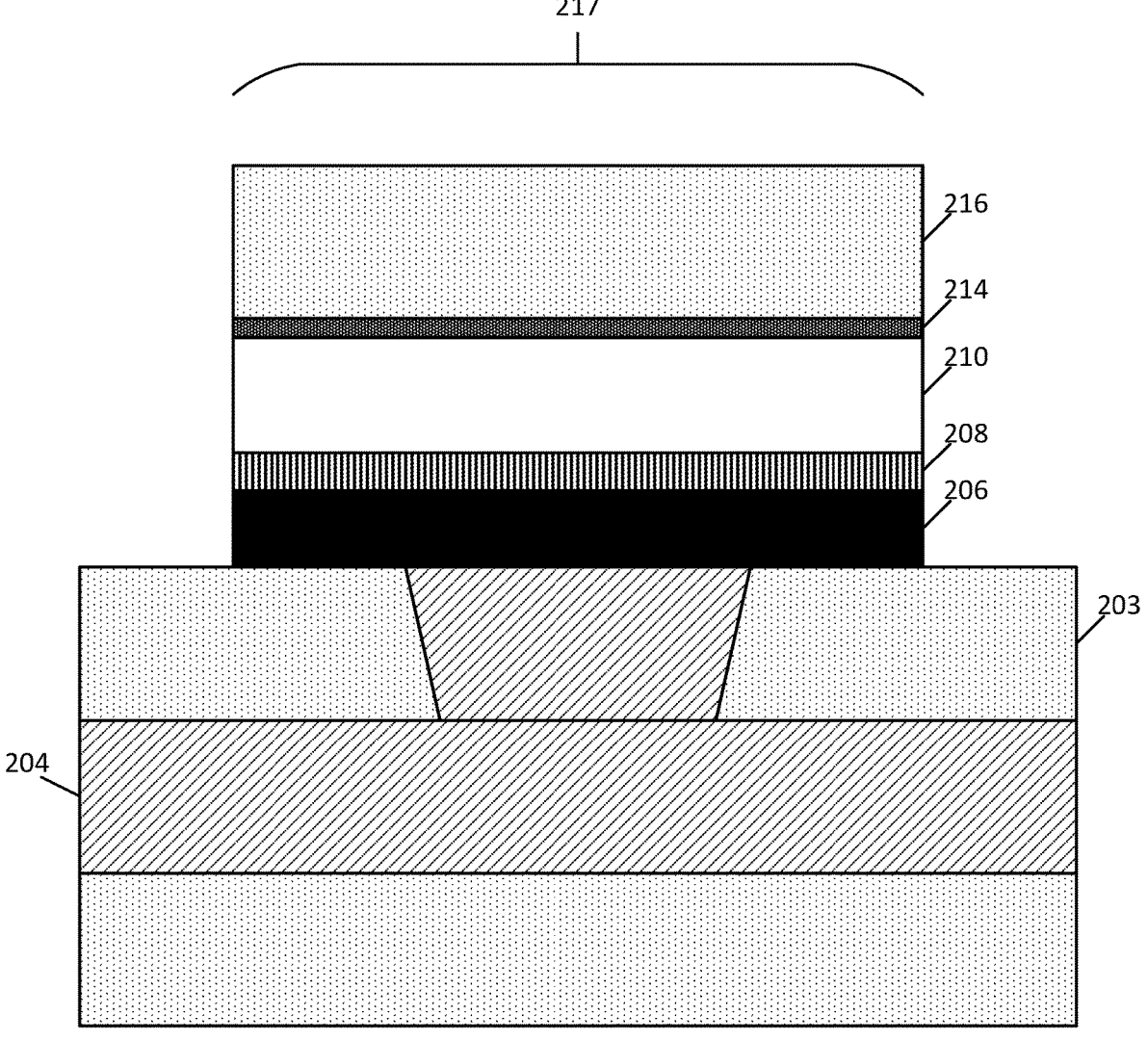

FIG. 2E is a cross-sectional view of the structure depicted in FIG. 2D after an etching process is performed to form an individual island of TFT layers 217. According to some embodiments, the etching process simultaneously forms multiple islands of TFT layers across any number of first conductive traces. An anisotropic etch may be performed to cut through a thickness of each of gate electrode 206, gate dielectric 208, semiconductor region 210, passivation layer 214, and dielectric layer(s) 216. In some embodiments, the etching process stops at a top surface of dielectric layer 203 or may stop after etching through a portion of dielectric layer 203. According to some embodiments, the etch depth at least cuts through an entire thickness of gate electrode 206. The full length of the resulting island of TFT layers 217 can vary from one embodiment to the next, but in some examples may be between about 50 nm and about 250 nm.

According to some embodiments, a width of the island of TFT layers 217 increases at successively higher tiers. The cross-section of FIG. 2E provides the length of TFT layers 217, while the width would extend into and out of the page. Greater widths of semiconductor region 210 while maintaining the same length generally provide higher conductivity in the resulting TFT structure. So, in some examples, the width of TFT layers 217 may, for instance, grade from a lowermost tier value up to a uppermost tier value, where the change from any one tier to the next tier is in the range of about 0.1 nm to about 10 nm. As previously noted, the grading may be done in a linear or interpolative fashion.

Figure 2F:
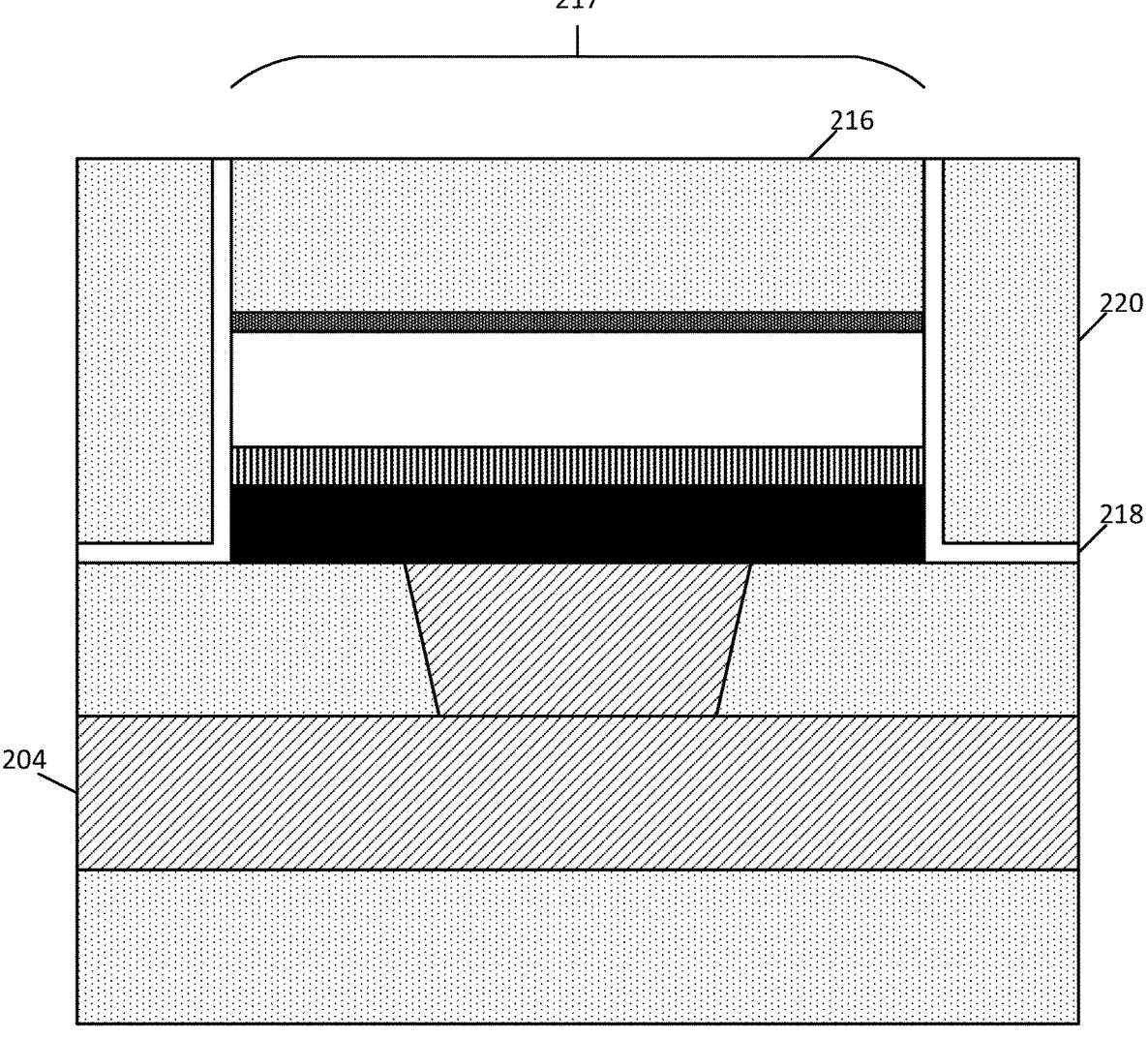

FIG. 2F is a cross-sectional view of the structure depicted in FIG. 2E following the formation of filler dielectric layers between adjacent islands of TFT layers 217, according to some embodiments. A dielectric liner 218 may be deposited over the sidewalls of TFT layers 217. According to some embodiments, dielectric liner 218 is a high-k material, such as hafnium oxide, with a thickness between about 0.5 nm and 5 nm. A dielectric fill 220 may be formed within any remaining volume between adjacent islands of TFT layers 217 and over dielectric liner 218. Dielectric fill 220 may include any suitable dielectric material such as silicon oxide, or any other dielectric material used on any of the other interconnect layers. According to some embodiments, both dielectric liner 218 and dielectric fill 220 are deposited over the whole structure and then polished back using, for example, CMP to expose a top surface of dielectric layer(s) 216.

Figure 2G:
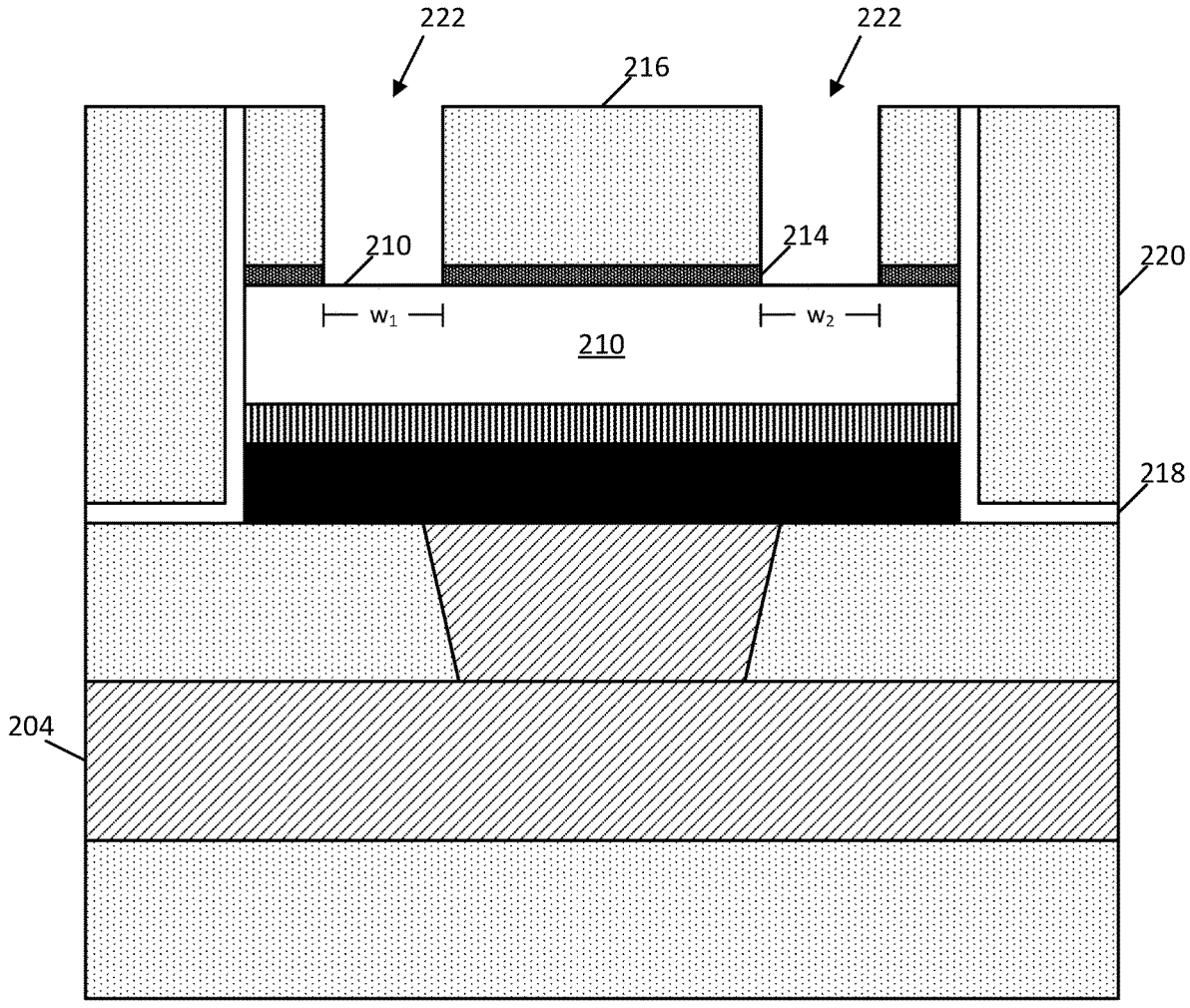

FIG. 2G is a cross-sectional view of the structure depicted in FIG. 2F following the formation of one or more contact recesses 222. According to one example, an anisotropic etching process may be performed through a thickness of at least dielectric layer(s) 216 and passivation layer 214 to expose at least a portion of a top surface of semiconductor region 210. Although recesses 222 are illustrated with straight walls, it should be understood that the etching process may yield inwardly tapered sidewalls.

According to some embodiments, the size of the contact recesses 222 are different depending on the tier in which the TFT structure is present. For example, higher tiers may have larger contact recesses 222 such that widths $w_1$ and $w_2$ are larger in higher tiers compared to lower tiers. The widths $w_1$ and $w_2$ represent the corresponding widths of the contact recesses 222 at the exposed surface of semiconductor region 210. The increase in the widths of recesses 222 may be gradually performed across the tiers, such that the lowest tier has the least wide recesses 222 and the highest tier has the widest recesses 222 with a gradient of recess 222 widths for the tiers in between. In some embodiments, only the width of one of the contact recesses ($w_1$ or $w_2$) increases at successively higher tiers while the width of the other one of the contact recesses stays relatively the same at successively higher tiers. Although changing width is discussed specifically here, the lengths of the recesses 222 (into and out of the page) where the top surface of semiconductor region 210 is exposed can also be increased in successively higher tiers. Generally, the cross-sectional exposed area of semiconductor region 210 at the bottom of recesses 222 may be made larger in successively higher tiers. As previously noted, any such geometric grading may be done in a linear or interpolative fashion but need not be (other examples may have non-linear or otherwise inconsistent geometric changes from one tier to the next).

Figure 2H:
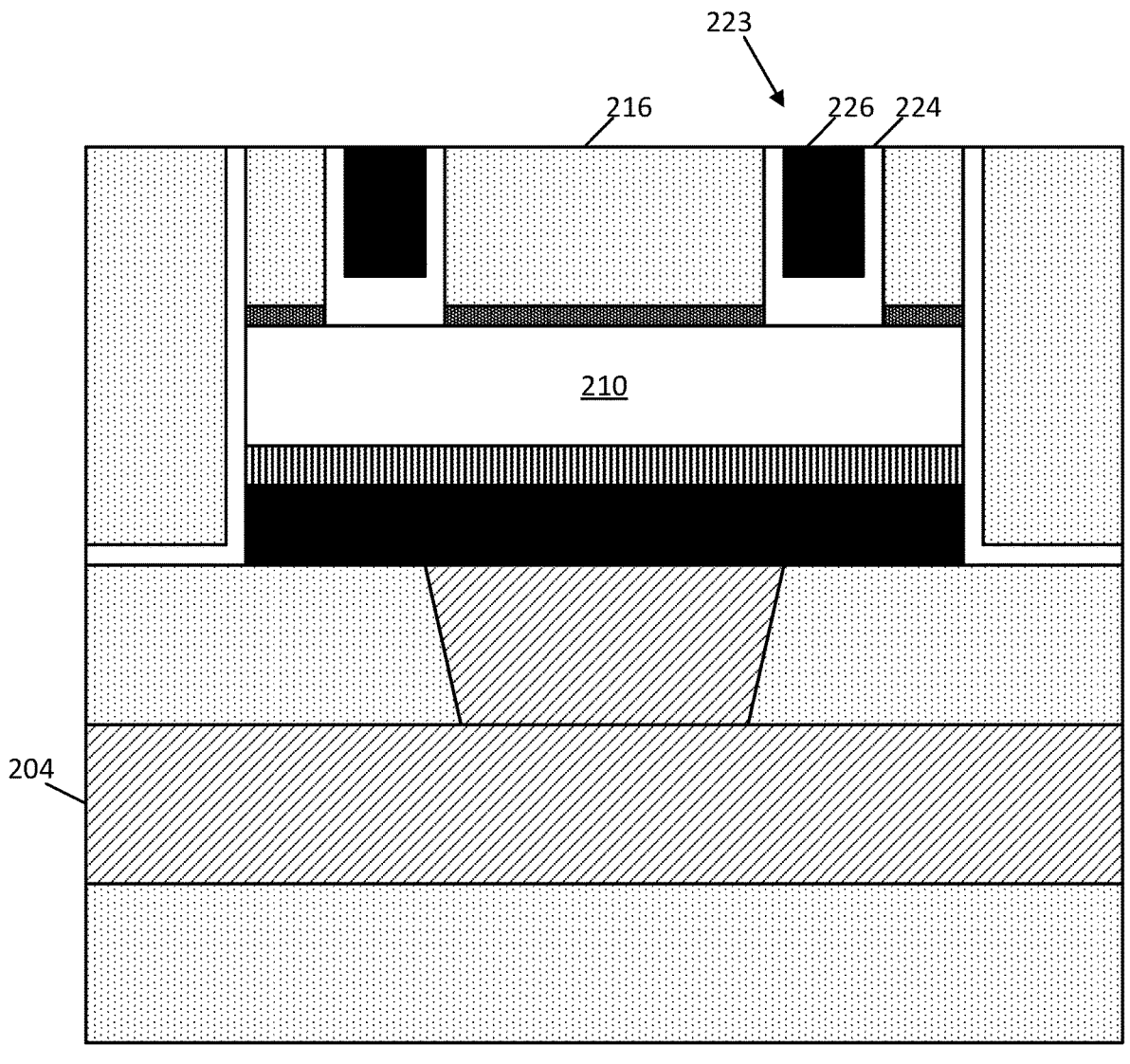

FIG. 2H is a cross-sectional view of the structure depicted in FIG. 2G following the formation of contacts 223 within contact recesses 222. According to some embodiments, contact 223 includes contact semiconductor layer(s) 224 and a metal fill 226. Contact semiconductor layer(s) 224 represent any number of formed semiconductor layers within recess 222, similar to semiconductor region 210. Accordingly, contact semiconductor layer(s) 224 may include silicon or any III-V or II-VI materials exhibiting semiconducting qualities. According to some embodiments, contact semiconductor layer(s) 224 includes metal oxide semiconductor material such as indium gallium zinc oxide (InGaZnO), indium zinc oxide (InZnO), indium oxide (InO), or gallium zinc oxide (GaZnO), to name a few examples. Like semiconductor region 210, contact semiconductor layer(s) 224 may include multiple formed semiconductor layers having varying properties to provide, for example, low contact resistance with semiconductor region 210, and a smoother energy bandgap transition with metal fill 226. According to some embodiments, contact semiconductor layer(s) 224 form along sidewalls of recess 222 and along a bottom surface of recess 222. The portion of contact semiconductor layer(s) 224 along the bottom surface of recess 222 may be thicker than the portion of contact semiconductor layer(s) 224 along sidewalls of recess 222.

According to some embodiments, the total thickness of contact semiconductor layer(s) 224 along the bottom surface of recess 222 may decrease at successively higher tiers. In some embodiments, the thickness of contact semiconductor layer(s) 224 within recess 222 continues to decrease at successively higher tiers until it is eliminated altogether at the highest tier or tiers (e.g., recess 222 only includes metal fill 226). The decrease in the thickness of contact semiconductor layer(s) 224 may be gradually performed across the tiers, such that a lowest tier has a greatest thickness of contact semiconductor layer(s) 224 and a highest tier has a lowest thickness of contact semiconductor layer(s) 224 (or no contact semiconductor layer(s) 224) with a gradient of contact semiconductor layer(s) 224 thicknesses for the tiers in between. Again, any such geometric grading may be done in a linear or interpolative fashion from tier to tier but need not be (other examples may have inconsistent changes from one tier to the next, but still generally have a grading from a max value to a min value).

Metal fill 226 may be any suitable interconnect contact metal, such as copper, ruthenium, tungsten, cobalt, molybdenum, titanium, tantalum, and alloys thereof. In some cases, metal fill 226 may be formed, for instance, using electroplating within the remaining volume of recess 222 following the formation of contact semiconductor layer(s) 224. Once both contact semiconductor layer(s) 224 and metal fill 226 have been formed within recess 222, they may both be polished back using, for example, CMP, to expose a top surface of dielectric layer(s) 216.

Figure 2I:
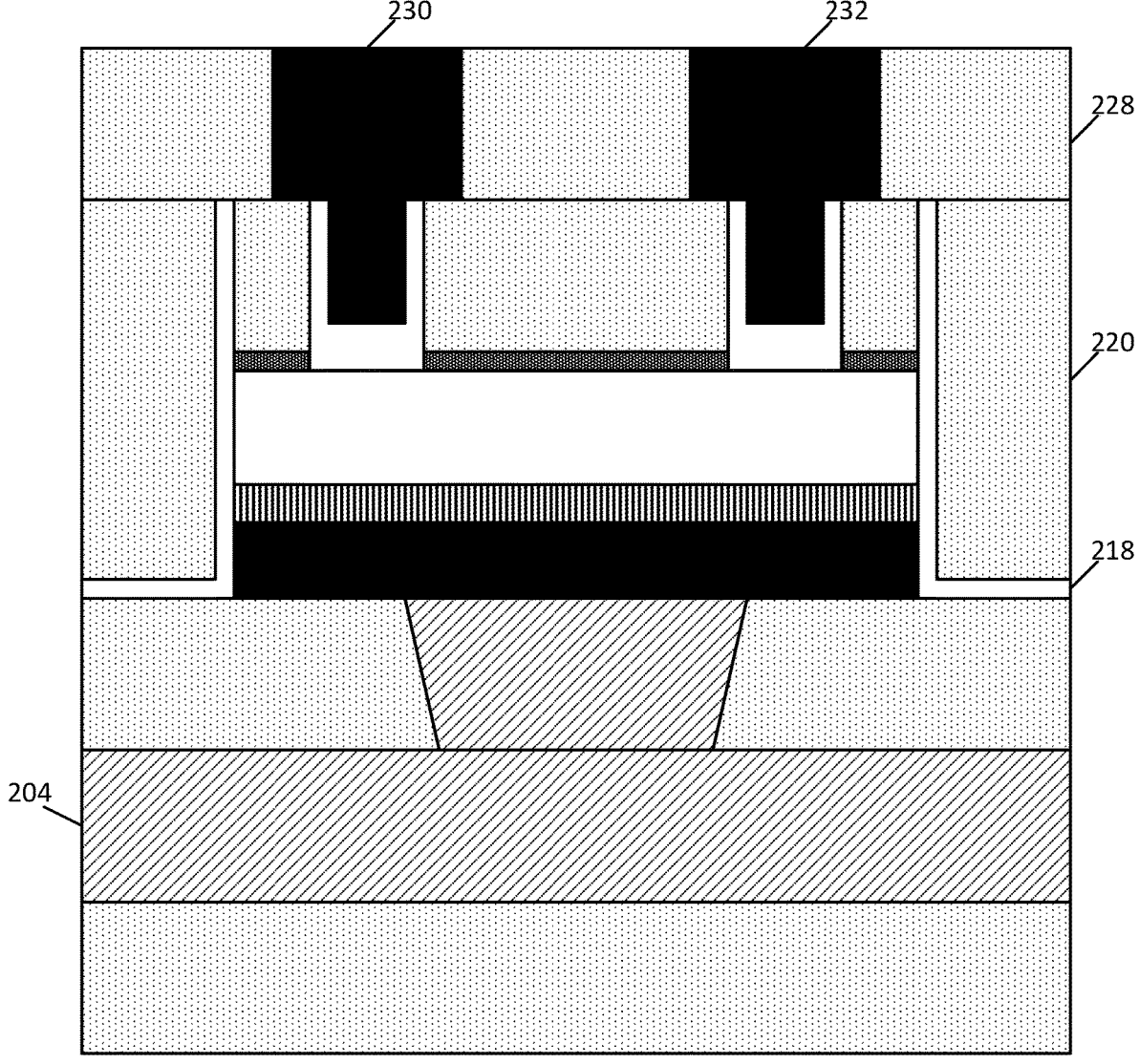

FIG. 2I is a cross-sectional view of the structure depicted in FIG. 2H following the formation of another interconnect layer 228 over the TFT structure. Interconnect layer 228 formed over the TFT structure includes a second conductive trace 230, a conductive via 232, and dielectric material surrounding the conductive features. The surrounding dielectric material may be similar to any other dielectric material (e.g., silicon dioxide or porous silicon dioxide) found in any of the other interconnect layers (such as dielectric material 112).

Second conductive trace 230 may be formed, for example, by first forming a recess within the surrounding dielectric material followed by filling the recess with a conductive material, such as copper, that is deposited using any one of electroplating, electroless plating, CVD, or PECVD, to name a few examples. After deposition of the conductive material within the recess, a polishing process may be performed using, for example, CMP to planarize a top surface of second conductive trace 230 with the surrounding dielectric material. In some embodiments, a thin barrier layer is conformally deposited (e.g., via ALD or CVD) first along the inner surfaces of the recess prior to the deposition of the remaining conductive material. The thin barrier layer may include, for example, tantalum or titanium, or a nitride of these. As discussed above, second conductive trace 230 may be one bitline of a plurality of parallel bitlines formed in the interconnect layer over the TFT structure. Accordingly, second conductive trace 230 may run into and out of the page orthogonally to first conductive trace 204. Second conductive trace 230 conductively contacts one of the contacts of the illustrated TFT structure and further contacts at least one of the contacts of other TFT structures along a row extending into and out of the page, according to some embodiments. Conductive via 232 may be conductively coupled only to one or more contacts of the illustrated TFT structure (and not coupled to any contacts of any other TFT structures). Conductive via 232 may include the same material composition and deposition process as second conductive trace 230.

Figure 2J:
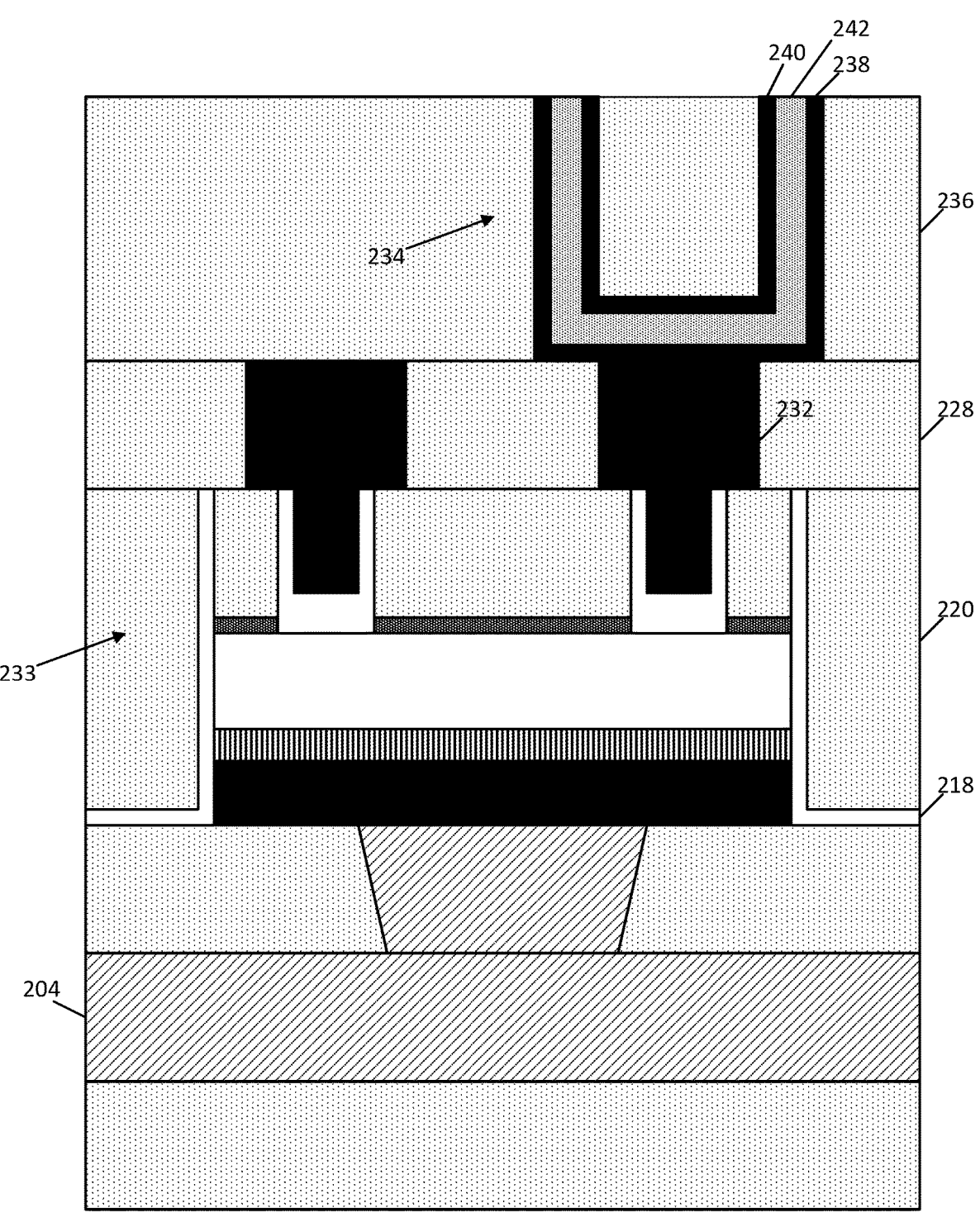

FIG. 2J is a cross-sectional view of the structure depicted in FIG. 2I following the formation of a capacitor 234 coupled to conductive via 232. As previously discussed, the TFT structure 233 is coupled to a corresponding capacitor 234 within another interconnect layer 236, and TFT structure 233 and capacitor 234, in combination, form or are part of a single TFT memory structure (e.g., an eDRAM cell).

In the TFT memory structure, capacitor 234 stores a bit of information and TFT structure 233 allows for writing and reading that bit. For example, capacitor 234 can either be charged to a first state or discharged to a second state, and these two states represent two bit values of 0 or 1. As illustrated in FIG. 2J, capacitor 234 comprises a first electrode 238 and a second electrode 240. Electrodes 238 and 240 may be formed in a 'U' shape as illustrated to provide a high opposing surface area between the electrodes. In other embodiments, capacitor 234 may have a different shape or configuration. For instance, rather than being U-shaped, capacitor 234 may have a relatively flat configuration with upper and lower electrodes, or a pillar-shaped configuration with inner and outer electrodes. In one embodiment, electrodes 238 and 240 may include any suitable electrically conductive material, such as a metal or metal alloy material including, e.g., copper, silver, aluminum, tantalum, aluminum, tungsten, nickel, platinum, molybdenum, manganese, or an alloy thereof, such as titanium nitride, tantalum nitride, titanium aluminum nitride, molybdenum oxide, manganese oxide, ruthenium, tungsten oxide, or another appropriate conductive material.

According to some embodiments, one or more dielectric layers 242 are formed on electrode 238, prior to the deposition of electrode 240. One or more dielectric layers 242 include any suitable dielectric material and form the "I" part of the MIM (metal-insulator-metal) capacitor 234. Note that one or more dielectric layers 242 may include one or more distinct and/or compositionally different layers of dielectric material. For example, one or more dielectric layers 242 may include one or more thin films of one or more metal oxides, such as one or more oxides of hafnium, aluminum, zirconium, titanium, tantalum, or another appropriate metal.

According to some embodiments, the capacitance of capacitor 234 decreases within successively increasing tiers. There is a strong correlation between the capacitance and signal delay, with a signal time constant ($\tau$) being roughly equal to R*C. Accordingly, as the resistance generally increases at successively higher tiers due to process effects, so does the time delay at successively higher tiers. Progressively decreasing the capacitance of higher tiers is an effective way to offset this increase in the signal time delay. In one example, the area between electrodes 238 and 240 is decreased at successively higher tiers. The area may be decreased by decreasing any of the geometric dimensions, such as the overall height, width, or length of capacitor 234. The decrease in the capacitor area may be gradually performed across the tiers, such that a lowest tier has a greatest capacitor area (and highest capacitance) and a highest tier has a lowest capacitor area (and lowest capacitance) with a gradient of capacitor areas for the tiers in between. In another example, a thickness of the capacitor dielectric (e.g., one or more dielectric layers 242) may be increased at successively higher tiers. The thickness increase may occur along all planes within capacitor 234 (e.g., along both horizontal and vertical planes), or primarily along the horizontal plane, according to some embodiments. The increase in the thickness of the capacitor dielectric may be gradually performed across the tiers, such that a lowest tier has a lowest capacitor dielectric thickness and a highest tier has a highest capacitor dielectric thickness with a gradient of capacitor dielectric thicknesses for the tiers in between. Again, any such geometric grading may be done in a linear or interpolative fashion from tier to tier but need not be (other examples may have inconsistent changes from one tier to the next, but still generally have a grading from a max capacitance value to a min capacitance value).

Figure 3:
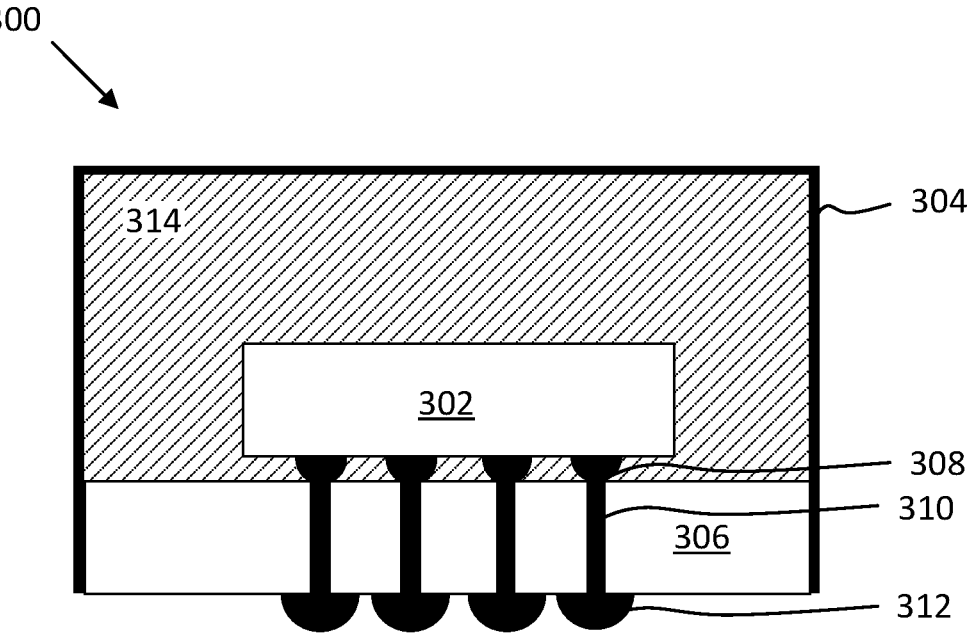
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having a structure as described in any of the aforementioned embodiments. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Example System

Figure 4:
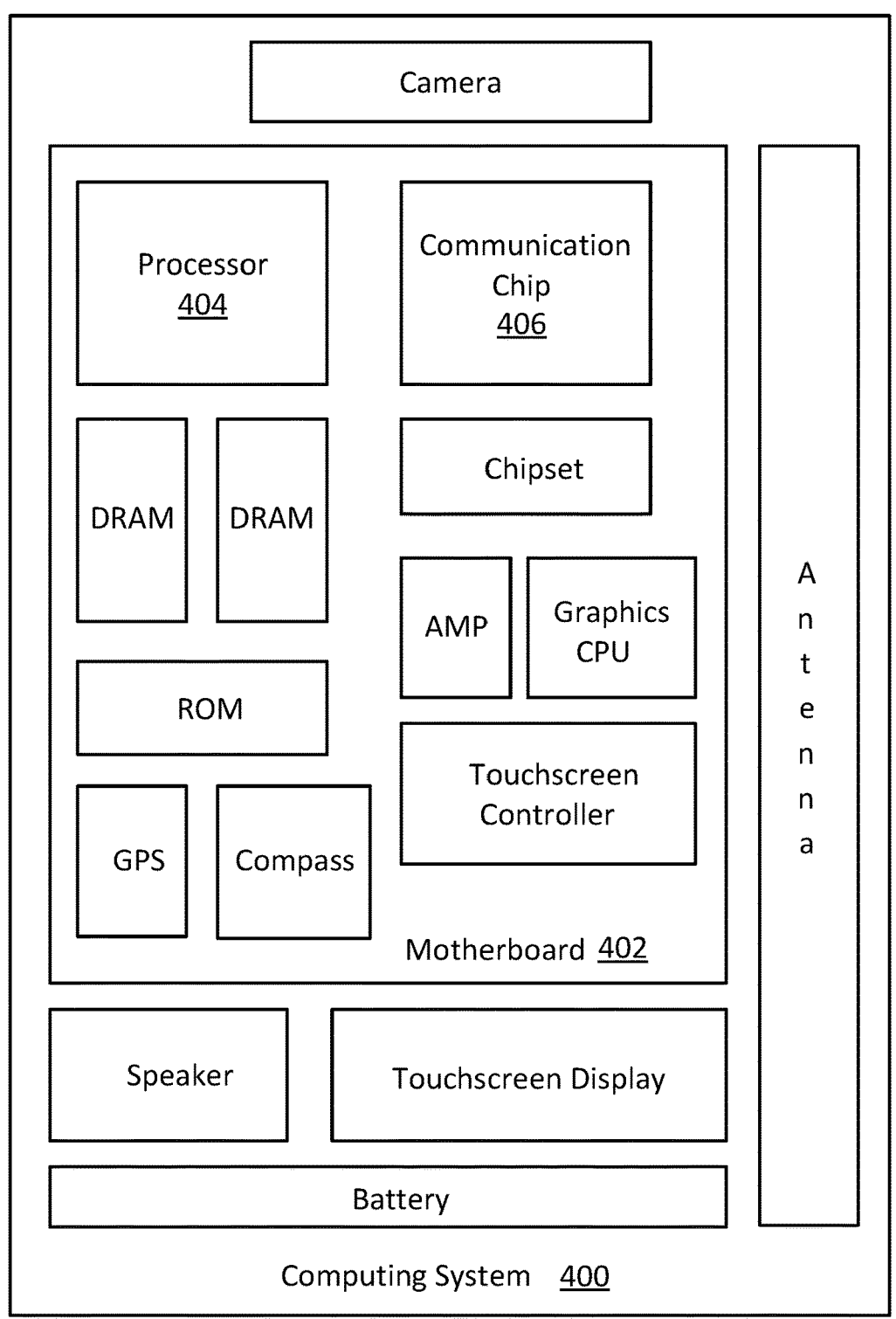
FIG. 4 illustrates a computing system including one or more integrated circuits, as variously described herein, in accordance with an embodiment of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board (PCB), whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., a module including an integrated circuit having interconnect structures that include tiers of backend memory cells having one or more graded parameters). In some embodiments, the inclusion of the backend memory cells may reduce the number of other DRAM chips included within computing system 400. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing system 400 includes an integrated circuit die packaged within the processor 404. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more semiconductor devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 400 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a device layer having a plurality of semiconductor devices, an interconnect structure above the device layer that includes a plurality of interconnect layers, and a multi-tier memory structure within the interconnect structure. The memory structure includes a first tier and a second tier above the first tier. The first tier includes first memory cells and the second tier includes second memory cells. The first memory cells include first transistors and first capacitors, and the second memory cells include second transistors and second capacitors. At least one transistor characteristic or capacitor characteristic of the first memory cells is graded with respect to at least one transistor characteristic or capacitor characteristic of the second memory cells.

Example 2 includes the subject matter of Example 1, wherein the memory structure includes an uppermost tier and a lowermost tier and one or more additional tiers between the uppermost and lowermost tiers, and at least one transistor characteristic or capacitor characteristic is incrementally graded from a maximum value associated with one of the uppermost or lowermost tiers to a minimum value associated with the other one of the uppermost or lowermost tiers.

Example 3 includes the subject matter of Example 1 or 2, wherein the at least one transistor characteristic or capacitor characteristic is with respect to a concentration of oxygen or sulfur vacancies within the first and second transistors, the second transistors having a higher concentration of oxygen or sulfur vacancies relative to the first transistors.

Example 4 includes the subject matter of any one of Examples 1-3, wherein the at least one transistor characteristic or capacitor characteristic is with respect to a concentration of an elemental semiconductor material within a channel layer of the first and second transistors, the second transistors having a lower concentration of the elemental semiconductor material relative to the first transistors.

Example 5 includes the subject matter of Example 4, wherein the elemental semiconductor material is gallium.

Example 6 includes the subject matter of any one of Examples 1-5, wherein the at least one transistor characteristic or capacitor characteristic is with respect to a concentration of an elemental semiconductor material within a channel layer of the first and second transistors, the second transistors having a higher concentration of the elemental semiconductor material relative to the first transistors.

Example 7 includes the subject matter of Example 6, wherein the elemental semiconductor material is indium.

Example 8 includes the subject matter of any one of Examples 1-7, wherein the at least one transistor characteristic or capacitor characteristic is with respect to a concentration of nitrogen within the first and second transistors, the second transistors having a lower concentration of nitrogen relative to the first transistors.

Example 9 includes the subject matter of any one of Examples 1-8, wherein the at least one transistor characteristic or capacitor characteristic is with respect to thickness of a channel layer within the first and second transistors, the second transistors having a thicker channel layer relative to the first transistors.

Example 10 includes the subject matter of any one of Examples 1-9, wherein the at least one transistor characteristic or capacitor characteristic is with respect to work function material within the first and second transistors, the second transistors having a higher concentration of p-type work function material relative to the first transistors.

Example 11 includes the subject matter of any one of Examples 1-10, wherein the at least one transistor characteristic or capacitor characteristic is with respect to thickness of a gate dielectric layer within the first and second transistors, the second transistors having a thinner gate dielectric layer relative to the first transistors.

Example 12 includes the subject matter of any one of Examples 1-11, wherein the at least one transistor characteristic or capacitor characteristic is with respect to area of a contact-to-channel interface within the first and second transistors, the second transistors having a larger area of contact-to-channel interface relative to the first transistors.

Example 13 includes the subject matter of any one of Examples 1-12, wherein the at least one transistor characteristic or capacitor characteristic is with respect to channel area between the source and drain contacts within the first and second transistors, the second transistors having a larger channel area between the source and drain contacts relative to the first transistors.

Example 14 includes the subject matter of any one of Examples 1-13, wherein the at least one transistor characteristic or capacitor characteristic is with respect to size of the first and second capacitors, the second capacitors being smaller relative to the first capacitors.

Example 15 includes the subject matter of any one of Examples 1-14, wherein the at least one transistor characteristic or capacitor characteristic is with respect to thickness of the capacitor dielectric of the first and second capacitors, the second capacitors having a thicker capacitor dielectric relative to the first capacitors.

Example 16 includes the subject matter of any one of Examples 1-15, wherein the second tier has a smaller array of memory cells relative to the first tier.

Example 17 is an integrated circuit that includes a plurality of semiconductor devices, an interconnect region above the plurality of semiconductor devices and having a plurality of stacked interconnect layers, a first thin film transistor (TFT) structure within a first interconnect layer of the plurality of stacked interconnect layers, and a second TFT structure within a second interconnect layer of the plurality of stacked interconnect layers. The second interconnect layer is over the first interconnect layer. The first TFT structure includes a first gate electrode, a first gate dielectric on the first gate electrode, a first semiconductor region on the first gate dielectric, and first and second conductive contacts that each contact a respective portion of the first semiconductor region. The second TFT structure includes a second gate electrode, a second gate dielectric on the second gate electrode, a second semiconductor region on the second gate dielectric, and third and fourth conductive contacts that each contact a respective portion of the second semiconductor region. The first semiconductor region has a lower concentration of oxygen vacancies compared to the second semiconductor region and/or a first cross-sectional area of contact between the first and second conductive contacts and the first semiconductor region is less than a second cross-sectional area of contact between the third and fourth conductive contacts and the second semiconductor region.

Example 18 includes the subject matter of Example 17, wherein the first TFT structure further comprises a first passivation layer over the first semiconductor region, such that the first and second conductive contacts extend through an entire thickness of the first passivation layer, and the second TFT structure further comprises a second passivation layer over the second semiconductor region, such that the third and fourth conductive contacts extend through an entire thickness of the second passivation layer.

Example 19 includes the subject matter of Example 18, wherein the first and second passivation layers comprise aluminum and oxygen.

Example 20 includes the subject matter of any one of Examples 17-19, wherein the first and second semiconductor regions each comprise oxygen, indium, gallium, and zinc.

Example 21 includes the subject matter of Example 20, wherein the first semiconductor region comprises a higher concentration of gallium compared to the second semiconductor region.

Example 22 includes the subject matter of Example 20 or 21, wherein the first semiconductor region comprises a lower concentration of indium compared to the second semiconductor region.

Example 23 includes the subject matter of any one of Examples 17-22, wherein the first semiconductor region has a higher concentration of nitrogen compared to the second semiconductor region.

Example 24 includes the subject matter of Example 23, wherein the nitrogen within each of the first and second semiconductor regions has a highest concentration along a top surface of each of the first and second semiconductor regions.

Example 25 includes the subject matter of any one of Examples 17-24, wherein the first semiconductor region has a greater thickness compared to the second semiconductor region.

Example 26 includes the subject matter of any one of Examples 17-25, wherein the first gate electrode has a higher concentration of any of platinum, gold, palladium, or cobalt compared to the second gate electrode.

Example 27 includes the subject matter of any one of Examples 17-26, wherein the second gate electrode has a higher concentration of any of titanium or tantalum compared to the first gate electrode.

Example 28 includes the subject matter of any one of Examples 17-27, wherein the second semiconductor region has a greater width compared to the first semiconductor region.

Example 29 includes the subject matter of any one of Examples 17-28, wherein the first gate dielectric is thicker than the second gate dielectric.

Example 30 includes the subject matter of any one of Examples 17-29, wherein the first and second contacts include a first semiconductor contact region on the first semiconductor region and a first metal fill, and the third and fourth contacts include a second semiconductor contact region on the second semiconductor region and a second metal fill.

Example 31 includes the subject matter of Example 30, wherein the first semiconductor contact region is thicker than the second semiconductor contact region.

Example 32 includes the subject matter of any one of Examples 17-31, wherein the first semiconductor region has a higher concentration of any of nitrogen, helium, or carbon compared to the second semiconductor region.

Example 33 includes the subject matter of any one of Examples 17-32, wherein the second semiconductor region has a higher concentration of any of hydrogen, fluorine, or chlorine compared to the first semiconductor region.

Example 34 includes the subject matter of any one of Examples 17-33, wherein the first contact or the second contact is coupled to a first metal-insulator-metal (MIM) capacitor and wherein the third contact or the fourth contact is coupled to a second metal-insulator-metal (MIM) capacitor.

Example 35 includes the subject matter of any one of Examples 17-34, wherein the first TFT structure is one TFT structure of a first array of TFT structures within the first interconnect layer, and the second TFT structure is one TFT structure of a second array of TFT structures within the second interconnect layer.

Example 36 is a printed circuit board comprising the integrated circuit of any one of Examples 17-35.

Example 37 is an electronic device having a chip package having one or more dies. At least one of the one or more dies includes the integrated circuit of any one of Examples 17-35.

Example 38 is an integrated circuit that includes a plurality of semiconductor devices, an interconnect region above the plurality of semiconductor devices and having a plurality of stacked interconnect layers, a first thin film transistor (TFT) structure within a first interconnect layer of the plurality of stacked interconnect layers; a first metal-insulator-metal (MIM) capacitor coupled to a first contact of the first TFT structure, a second TFT structure within a second interconnect layer above the first interconnect layer of the plurality of stacked interconnect layers, and a second metal-insulator-metal (MIM) capacitor coupled to a second contact of the second TFT structure. The first MIM capacitor has a larger capacitance compared to the second MIM capacitor.

Example 39 includes the subject matter of Example 38, wherein the first MIM capacitor is formed within a third interconnect layer over the first interconnect layer and beneath the second interconnect layer, and the second MIM capacitor is formed within a fourth interconnect layer over the second interconnect layer.

Example 40 includes the subject matter of Example 38 or 39, wherein the first MIM capacitor comprises first metal electrodes and the second MIM capacitor comprises second metal electrodes, wherein an area between the first metal electrodes is greater than an area between the second metal electrodes.

Example 41 includes the subject matter of any one of Examples 38-40, wherein the first MIM capacitor comprises a first dielectric layer between first metal electrodes and the second MIM capacitor comprises a second dielectric layer between second metal electrodes, wherein the first dielectric layer is thinner than the second dielectric layer.

Example 42 includes the subject matter of Example 41, wherein the first dielectric layer and the second dielectric layer each comprise a high-K dielectric material.

Example 43 includes the subject matter of any one of Examples 38-42, wherein the first TFT structure is one TFT structure of a first array of TFT structures within the first interconnect layer, and the second TFT structure is one TFT structure of a second array of TFT structures within the second interconnect layer.

Example 44 is a printed circuit board comprising the integrated circuit of any one of Examples 38-43.

Example 45 is an electronic device having a chip package having one or more dies. At least one of the one or more dies includes the integrated circuit of any one of Examples 38-43.

Example 46 is an integrated circuit that includes a plurality of semiconductor devices, an interconnect region above the plurality of semiconductor devices and having a plurality of stacked interconnect layers, a first thin film transistor (TFT) structure within a first interconnect layer of the plurality of stacked interconnect layers and having a first semiconductor region on a first gate dielectric, and a second TFT structure within a second interconnect layer over the first interconnect layer of the plurality of stacked interconnect layers and having a second semiconductor region on a second gate dielectric. The first semiconductor region has at least one of a lower concentration of oxygen vacancies, a higher concentration of gallium, a lower concertation of indium, a higher concentration of nitrogen, a lower width, or a lower thickness compared to the second semiconductor region.

Example 47 includes the subject matter of Example 46, wherein the first TFT structure further comprises a first passivation layer over the first semiconductor region and the second TFT structure further comprises a second passivation layer over the second semiconductor region.

Example 48 includes the subject matter of Example 47, wherein the first and second passivation layers comprise aluminum and oxygen.

Example 49 includes the subject matter of any one of Examples 46-48, wherein the first and second semiconductor regions each comprise oxygen, indium, gallium, and zinc.

Example 50 includes the subject matter of any one of Examples 46-49, wherein nitrogen within each of the first and second semiconductor regions has a highest concentration along a top surface of each of the first and second semiconductor regions.

Example 51 includes the subject matter of any one of Examples 46-50, wherein the first semiconductor region has a higher concentration of any of platinum, gold, palladium, or cobalt compared to the second semiconductor region.

Example 52 includes the subject matter of any one of Examples 46-51, wherein the second semiconductor region has a higher concentration of any of titanium or tantalum compared to the first semiconductor region.

Example 53 includes the subject matter of any one of Examples 46-52, wherein the first gate dielectric is thicker than the second gate dielectric.

Example 54 includes the subject matter of any one of Examples 46-53, wherein the first semiconductor region has a higher concentration of any of nitrogen, helium, or carbon compared to the second semiconductor region.

Example 55 includes the subject matter of any one of Examples 46-54, wherein the second semiconductor region has a higher concentration of any of hydrogen, fluorine, or chlorine compared to the first semiconductor region.

Example 56 includes the subject matter of any one of Examples 46-55, wherein the first TFT structure comprises a first contact coupled to a first metal-insulator-metal (MIM) capacitor and wherein the second TFT structure comprises a second contact coupled to a second metal-insulator-metal (MIM) capacitor.

Example 57 includes the subject matter of Example 56, wherein the first MIM capacitor has a larger capacitance compared to the second MIM capacitor.

Example 58 includes the subject matter of Example 57, wherein the first MIM capacitor comprises first metal electrodes and the second MIM capacitor comprises second metal electrodes, wherein an area between the first metal electrodes is greater than an area between the second metal electrodes.

Example 59 includes the subject matter of Example 57 or 58, wherein the first MIM capacitor comprises a first dielectric layer between first metal electrodes and the second MIM capacitor comprises a second dielectric layer between second metal electrodes, wherein the first dielectric layer is thinner than the second dielectric layer.

Example 60 includes the subject matter of any one of Examples 56-59, wherein the first MIM capacitor is formed within a third interconnect layer over the first interconnect layer and beneath the second interconnect layer, and the second MIM capacitor is formed within a fourth interconnect layer over the second interconnect layer.

Example 61 includes the subject matter of any one of Examples 46-60, wherein the first TFT structure is one TFT structure of a first array of TFT structures within the first interconnect layer, and the second TFT structure is one TFT structure of a second array of TFT structures within the second interconnect layer.

Example 62 is a printed circuit board comprising the integrated circuit of any one of Examples 46-61.

Example 63 is an electronic device having a chip package having one or more dies. At least one of the one or more dies includes the integrated circuit of any one of Examples 46-61.

The foregoing description of the embodiments of the disclosure has been presented for the purposes of illustration and description. It is not intended to be exhaustive or to limit the disclosure to the precise forms disclosed. Many modifications and variations will be apparent in light of this disclosure. It is intended that the scope of the disclosure be limited not by this detailed description, but rather by the claims appended hereto.

What is claimed is:

1. An integrated circuit, comprising:
a device layer including a plurality of semiconductor devices;
an interconnect structure above the device layer and including a plurality of interconnect layers; and
a multi-tier memory structure within the interconnect structure, the memory structure including a first tier and a second tier above the first tier, the first tier including first memory cells and the second tier including second memory cells, the first memory cells including first transistors and first capacitors, and the second memory cells including second transistors and second capacitors, wherein at least one transistor characteristic or capacitor characteristic of the first memory cells is graded with respect to at least one transistor characteristic or capacitor characteristic of the second memory cells.

2. The integrated circuit of claim 1, wherein the memory structure includes an uppermost tier and a lowermost tier and one or more additional tiers between the uppermost and lowermost tiers, and at least one transistor characteristic or capacitor characteristic is incrementally graded from a maximum value associated with one of the uppermost or lowermost tiers to a minimum value associated with the other one of the uppermost or lowermost tiers.

3. The integrated circuit of claim 1, wherein the at least one transistor characteristic or capacitor characteristic is with respect to a concentration of oxygen or sulfur vacancies within the first and second transistors, the second transistors having a higher concentration of oxygen or sulfur vacancies relative to the first transistors.

4. The integrated circuit of claim 1, wherein the at least one transistor characteristic or capacitor characteristic is with respect to a concentration of an elemental semiconductor material within a channel layer of the first and second transistors, the second transistors having a lower concentration of the elemental semiconductor material relative to the first transistors.

5. The integrated circuit of claim 1, wherein the at least one transistor characteristic or capacitor characteristic is with respect to a concentration of an elemental semiconductor material within a channel layer of the first and second transistors, the second transistors having a higher concentration of the elemental semiconductor material relative to the first transistors.

6. The integrated circuit of claim 1, wherein the at least one transistor characteristic or capacitor characteristic is with respect to area of a contact-to-channel interface within the first and second transistors, the second transistors having a larger area of contact-to-channel interface relative to the first transistors.

7. The integrated circuit of claim 1, wherein the at least one transistor characteristic or capacitor characteristic is with respect to channel area between the source and drain contacts within the first and second transistors, the second transistors having a larger channel area between the source and drain contacts relative to the first transistors.

8. A printed circuit board comprising the integrated circuit of claim 1.

9. An integrated circuit, comprising:
a plurality of semiconductor devices;

an interconnect region above the plurality of semiconductor devices, the interconnect region comprising a plurality of stacked interconnect layers;

a first thin film transistor (TFT) structure within a first interconnect layer of the plurality of stacked interconnect layers;

a first metal-insulator-metal (MIM) capacitor coupled to a first contact of the first TFT structure;

a second TFT structure within a second interconnect layer of the plurality of stacked interconnect layers, the second interconnect layer being over the first interconnect layer; and a second metal-insulator-metal (MIM) capacitor coupled to a second contact of the second TFT structure;

wherein the first MIM capacitor has a larger capacitance compared to the second MIM capacitor.

10. The integrated circuit of claim 9, wherein the first MIM capacitor comprises first metal electrodes and the second MIM capacitor comprises second metal electrodes, wherein an area between the first metal electrodes is greater than an area between the second metal electrodes.

11. The integrated circuit of claim 9, wherein the first MIM capacitor comprises a first dielectric layer between first metal electrodes and the second MIM capacitor comprises a second dielectric layer between second metal electrodes, wherein the first dielectric layer is thinner than the second dielectric layer.

12. The integrated circuit of claim 9, wherein the first TFT structure is one TFT structure of a first array of TFT structures within the first interconnect layer, and the second TFT structure is one TFT structure of a second array of TFT structures within the second interconnect layer.

13. An integrated circuit, comprising:

a plurality of semiconductor devices;

an interconnect region above the plurality of semiconductor devices, the interconnect region comprising a plurality of stacked interconnect layers;

a first thin film transistor (TFT) structure within a first interconnect layer of the plurality of stacked interconnect layers, the first TFT structure comprising a first semiconductor region on a first gate dielectric; and a second TFT structure within a second interconnect layer of the plurality of stacked interconnect layers, the second interconnect layer being over the first interconnect layer, the second TFT structure comprising a second semiconductor region on a second gate dielectric;

wherein the first semiconductor region has at least one of a lower concentration of oxygen vacancies, a higher concentration of gallium, a lower concertation of indium, a higher concentration of nitrogen, a lower width, or a lower thickness compared to the second semiconductor region.

14. The integrated circuit of claim 13, wherein the first and second semiconductor regions each comprise oxygen, indium, gallium, and zinc.

15. The integrated circuit of claim 13, wherein nitrogen within each of the first and second semiconductor regions has a highest concentration along a top surface of each of the first and second semiconductor regions.

16. The integrated circuit of claim 13, wherein the first gate dielectric is thicker than the second gate dielectric.

17. The integrated circuit of claim 13, wherein the first semiconductor region has a higher concentration of any of nitrogen, helium, or carbon compared to the second semiconductor region.

18. The integrated circuit of claim 13, wherein the second semiconductor region has a higher concentration of any of hydrogen, fluorine, or chlorine compared to the first semiconductor region.

19. The integrated circuit of claim 13, wherein the first TFT structure comprises a first contact coupled to a first metal-insulator-metal (MIM) capacitor and wherein the second TFT structure comprises a second contact coupled to a second metal-insulator-metal (MIM) capacitor.

20. The integrated circuit of claim 19, wherein the first MIM capacitor has a larger capacitance compared to the second MIM capacitor.

* * * * *